(12) United States Patent
Saida et al.

(10) Patent No.: US 8,848,433 B2
(45) Date of Patent: Sep. 30, 2014

(54) NONVOLATILE MEMORY DEVICE

(71) Applicant: Kabushiki Kaisha Toshiba, Tokyo (JP)

(72) Inventors: Daisuke Saida, Tokyo (JP); Minoru Amano, Kanagawa-ken (JP); Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 13/795,620

(22) Filed: Mar. 12, 2013

(65) Prior Publication Data

US 2014/0085968 A1   Mar. 27, 2014

(30) Foreign Application Priority Data

Sep. 26, 2012   (JP) ................. 2012-213274

(51) Int. Cl.
*G11C 11/00* (2006.01)
*G11C 11/16* (2006.01)

(52) U.S. Cl.
CPC ................. *G11C 11/1675* (2013.01)
USPC .......................................... 365/158; 365/173

(58) Field of Classification Search
USPC .......................... 365/158, 171, 173
See application file for complete search history.

(56) References Cited

U.S. PATENT DOCUMENTS

| | | | |
|---|---|---|---|
| 8,085,582 B2 | 12/2011 | Nakamura et al. | |
| 2011/0157967 A1* | 6/2011 | Suzuki et al. | 365/158 |
| 2012/0068281 A1 | 3/2012 | Saida et al. | |
| 2012/0236633 A1 | 9/2012 | Saida et al. | |
| 2012/0241827 A1 | 9/2012 | Daibou et al. | |
| 2012/0243308 A1 | 9/2012 | Saida et al. | |

FOREIGN PATENT DOCUMENTS

WO   2009/133650 A1   11/2009

OTHER PUBLICATIONS

U.S. Appl. No. 13/601,343, filed Aug. 31, 2012, Daisuke Saida, et al.
U.S. Appl. No. 13/416,724, filed Mar. 9, 2012, Daisuke Saida, et al.
U.S. Appl. No. 13/416,076, filed Mar. 9, 2012, Daisuke Saida, et al.
U.S. Appl. No. 13/416,408, filed Mar. 9, 2012, Daisuke Saida, et al.
U.S. Appl. No. 13/845,478, filed Mar. 18, 2013, Saida, et al.
U.S. Appl. No. 14/184,920, filed Feb. 20, 2014, Saida, et al.

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to one embodiment, a nonvolatile memory device includes: a magnetic memory element and a control unit. The magnetic memory element includes a stacked body, and a first and a second stacked units. The first stacked unit includes a first and second ferromagnetic layers and a first nonmagnetic layer provided between the first and the second ferromagnetic layers. The second stacked unit includes a third ferromagnetic layer and a nonmagnetic tunneling barrier layer stacked with the third ferromagnetic layer. The control unit is configured to implement a first operation of setting the magnetic memory element to be in a first state. The first operation includes a first preliminary operation of applying a first pulse voltage; and a first setting operation of applying a second pulse voltage having a second rising time to the magnetic memory element after the first preliminary operation.

20 Claims, 17 Drawing Sheets

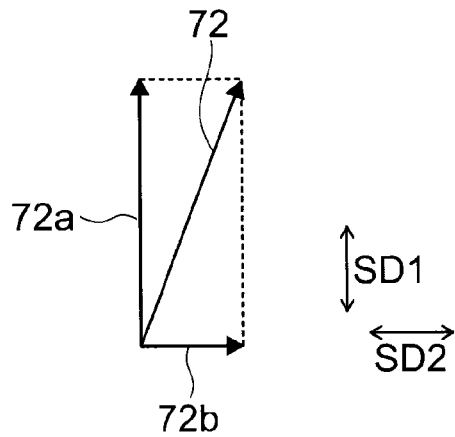
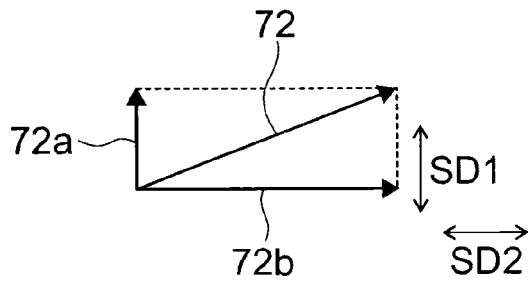
FIG. 2A  FIG. 2B
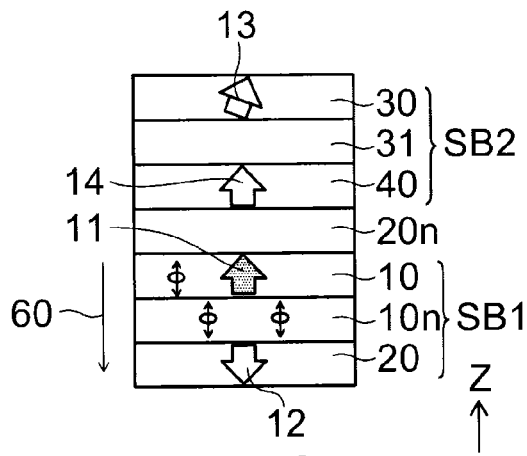
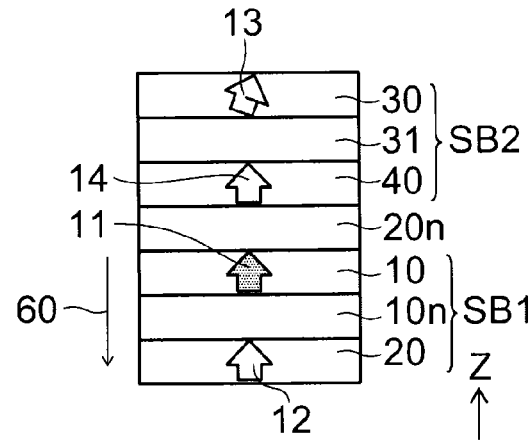
FIG. 3A  FIG. 3B
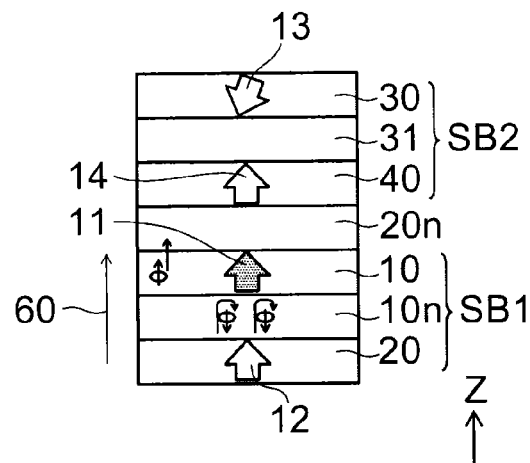
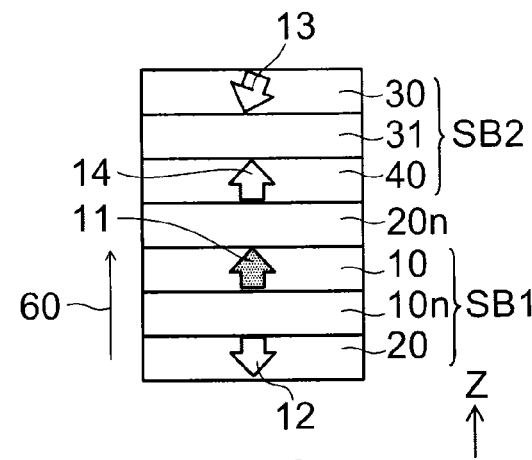
FIG. 3C  FIG. 3D

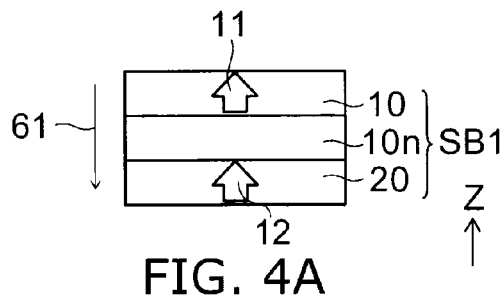
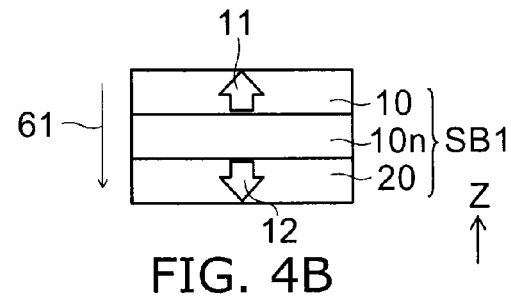
FIG. 4A  FIG. 4B
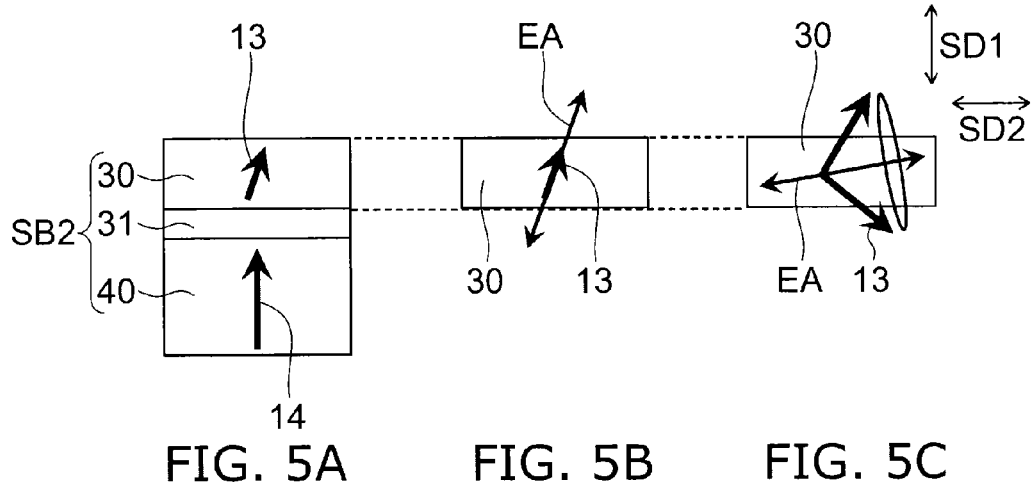
FIG. 5A  FIG. 5B  FIG. 5C
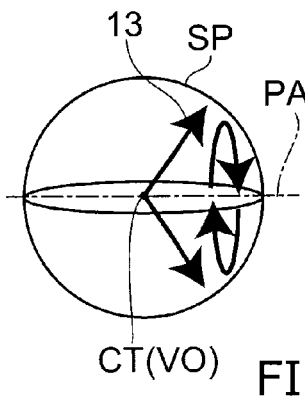
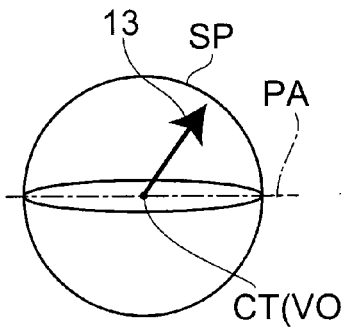
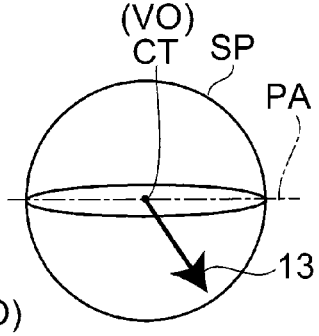
FIG. 6A  FIG. 6B  FIG. 6D
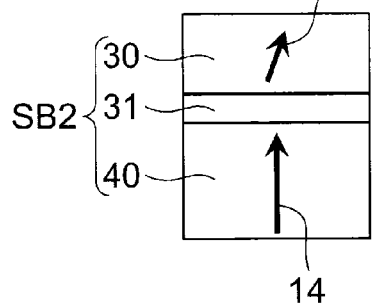
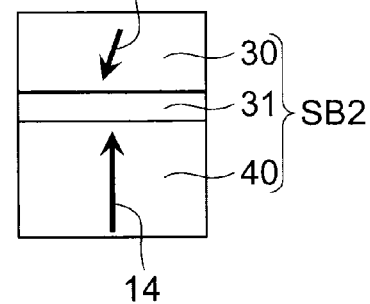
FIG. 6C  FIG. 6E FIG. 18A
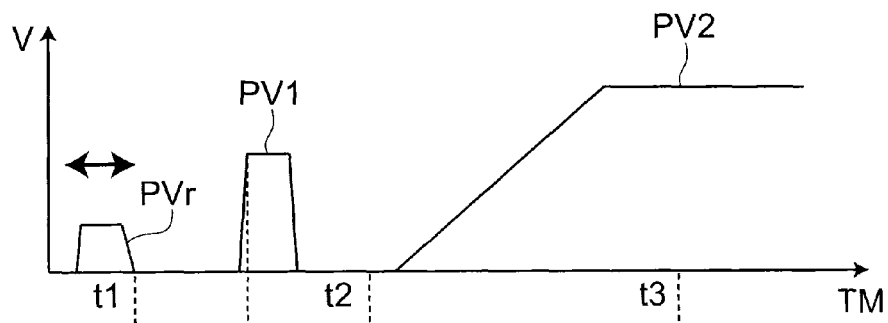
FIG. 18B
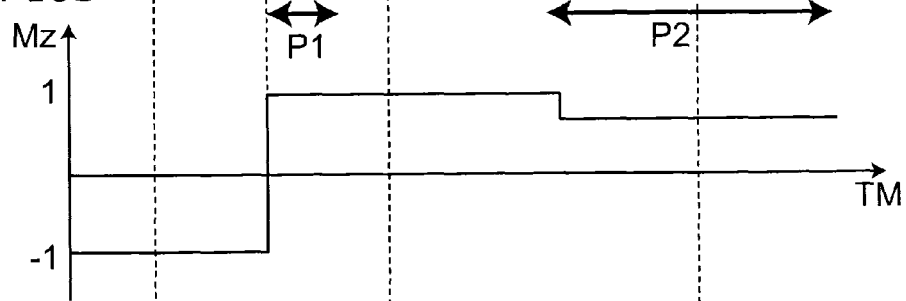
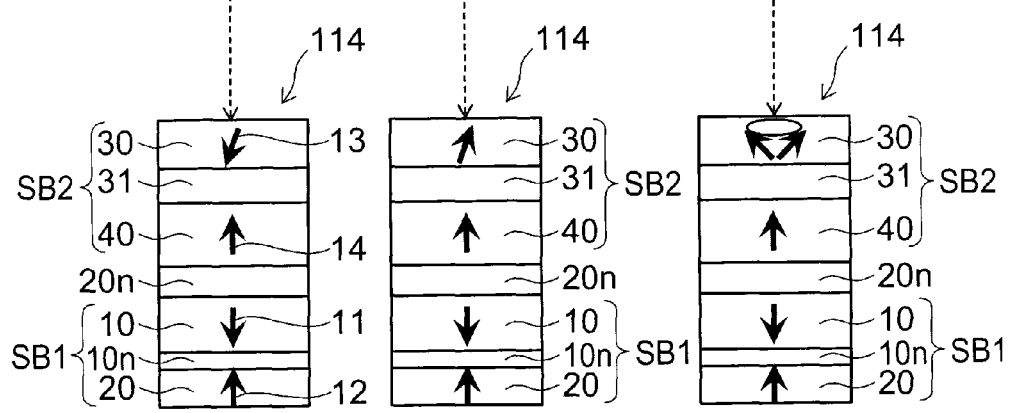
FIG. 18C  FIG. 18D  FIG. 18E

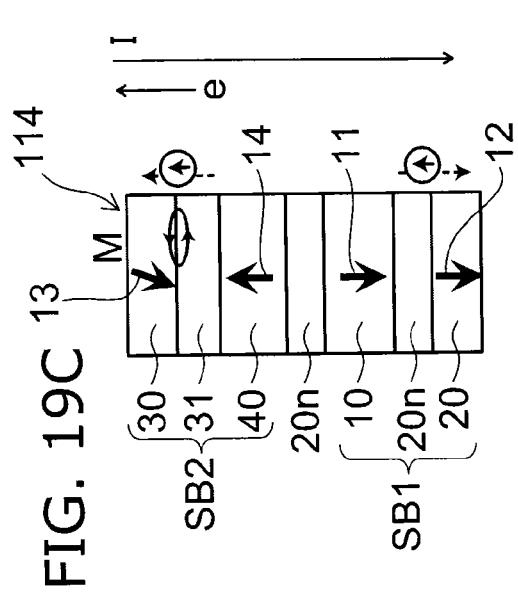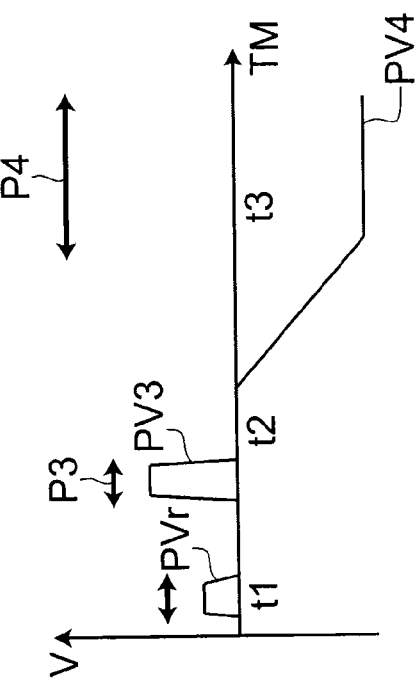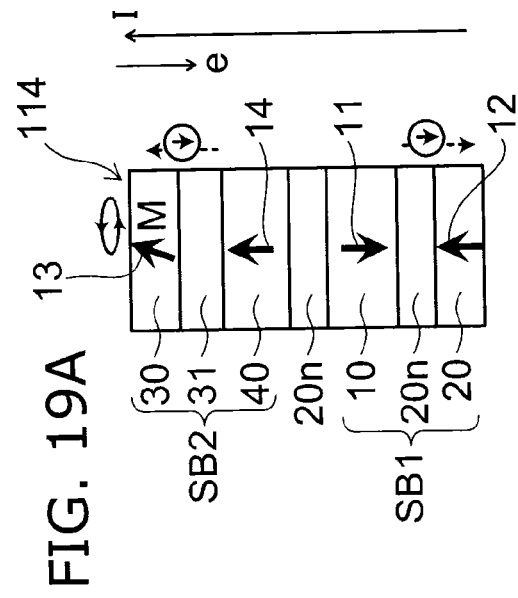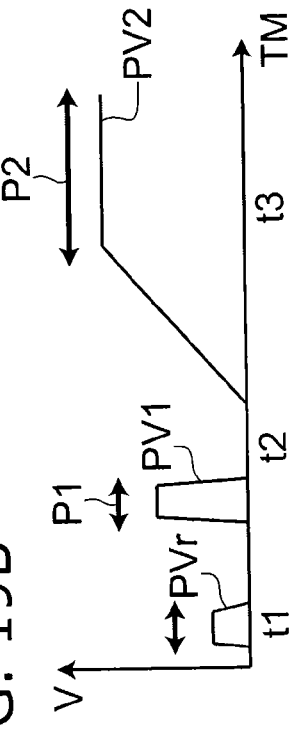

NONVOLATILE MEMORY DEVICE

CROSS-REFERENCE TO RELATED APPLICATIONS

This application is based upon and claims the benefit of priority from the prior Japanese Patent Application No. 2012-213274, filed on Sep. 26, 2012; the entire contents of which are incorporated herein by reference.

FIELD

Embodiments described herein relate generally to a nonvolatile memory device.

BACKGROUND

A configuration of magnetic random access memory (MRAM) has a data storage unit that uses a magnetic tunnel junction (MTJ) element that exhibits a tunneling magnetoresistive (TMR) effect. Such a configuration is drawing attention as a high-speed/large-capacity nonvolatile memory device. It is desirable to suppress misoperations in such a nonvolatile memory device.

BRIEF DESCRIPTION OF THE DRAWINGS

FIG. 2A and FIG. 2B are schematic views showing a magnetization;

FIG. 3A to FIG. 3D are schematic views showing an operations of the nonvolatile memory device according to the first embodiment;

FIG. 4A and FIG. 4B are schematic views showing an operation of the nonvolatile memory device according to the first embodiment;

FIG. 5A to FIG. 5C are schematic views showing an operation of the magnetic memory element according to the first embodiment;

FIG. 6A to FIG. 6E are schematic views showing an operation of the magnetic memory element according to the first embodiment;

FIG. 18A to FIG. 18E are schematic views showing an example of the nonvolatile memory device according to the first embodiment;

FIG. 19A to FIG. 19D are schematic views showing another example of the nonvolatile memory device according to the first embodiment;

DETAILED DESCRIPTION

Figure 1:
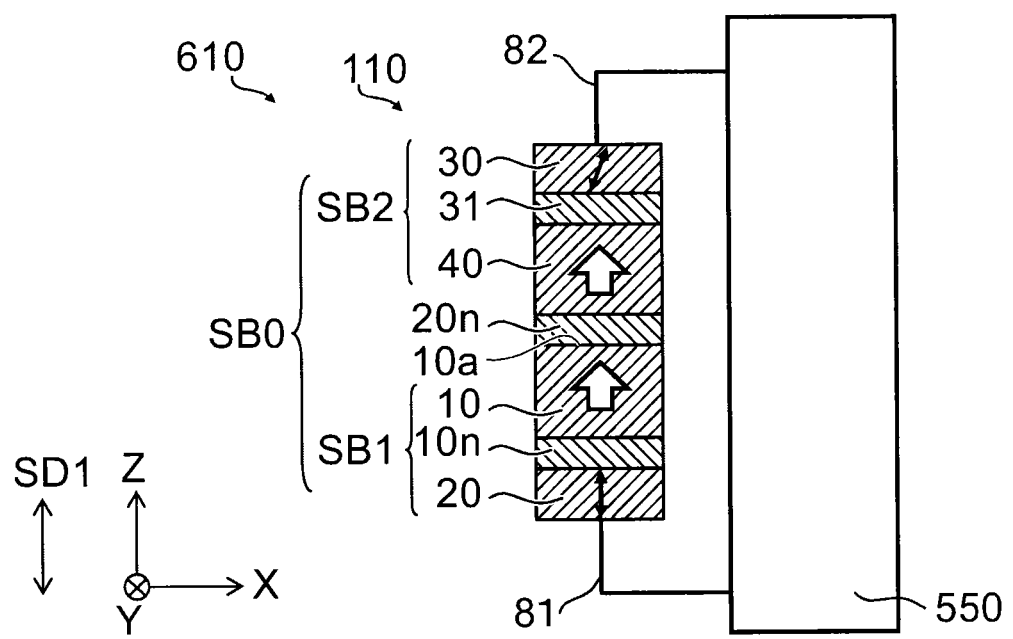
FIG. 1 is a schematic cross-sectional view showing a nonvolatile memory device according to a first embodiment.

In general, according to an embodiment of the invention, a nonvolatile memory device includes: a magnetic memory element including a stacked body, the stacked body including a first stacked unit including: a first ferromagnetic layer having a fixed direction of magnetization; a second ferromagnetic layer having a changeable direction of magnetization; and a first nonmagnetic layer provided between the first ferromagnetic layer and the second ferromagnetic layer, the first ferromagnetic layer, the second ferromagnetic layer, and the first nonmagnetic layer being stacked in a stacking direction, and a second stacked unit stacked with the first stacked unit in the stacking direction including: a third ferromagnetic layer having a changeable direction of magnetization; and a nonmagnetic tunneling barrier layer stacked with the third ferromagnetic layer in the stacking direction to contact the third ferromagnetic layer; and a control unit electrically connected to the magnetic memory element, the control unit being configured to implement a first operation of setting the magnetic memory element to be in a first state, the first operation including: a first preliminary operation of applying a first pulse voltage having a first rising time to the magnetic memory element; and a first setting operation of applying a second pulse voltage having a second rising time to the magnetic memory element after the first preliminary operation, the second rising time being longer than the first rising time.

Embodiments will now be described with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a nonvolatile memory device according to a first embodiment.

As shown in FIG. 1, the nonvolatile memory device 610 according to the embodiment includes a magnetic memory element 110 and a control unit 550.

The magnetic memory element 110 includes a stacked body SB0. The stacked body SB0 includes a first stacked unit SB1 and a second stacked unit SB2.

The control unit 550 is electrically connected to the magnetic memory element 110. The control unit 550 controls the operation of the magnetic memory element 110 by applying a voltage and supplying a current to the magnetic memory element 110.

The first stacked unit SB1 includes a first ferromagnetic layer 10, a second ferromagnetic layer 20, and a first nonmagnetic layer 10n.

The first ferromagnetic layer 10 has a major surface 10a. The direction of the magnetization of the first ferromagnetic layer 10 is substantially fixed. The direction of the magnetization of the first ferromagnetic layer 10 has, for example, a component perpendicular to the major surface 10a. The direction of the magnetization of the first ferromagnetic layer 10 is non-parallel to the major surface 10a.

The direction of the magnetization of the second ferromagnetic layer 20 is changeable. The first nonmagnetic layer 10n is provided between the first ferromagnetic layer 10 and the second ferromagnetic layer 20. The first ferromagnetic layer 10, the second ferromagnetic layer 20, and the first nonmagnetic layer 10n are stacked in a stacking direction SD1. The stacking direction SD1 is, for example, perpendicular to the major surface 10a.

In the specification of the application, the state of being stacked includes not only the state of being overlaid in direct contact but also the case of being overlaid with another component inserted therebetween.

A direction parallel to the stacking direction SD1 of the first stacked unit SB1 is taken as a Z-axis direction. One axis perpendicular to the Z axis is taken as an X axis. An axis perpendicular to the X axis and the Z axis is taken as a Y axis. The film surfaces of the layers included in the stacked body SB0 are parallel to the X-Y plane. For example, the major surface 10a is parallel to the X-Y plane.

The second stacked unit SB2 is stacked with the first stacked unit SB1 in the stacking direction SD1. The second stacked unit SB2 includes a third ferromagnetic layer 30 and a nonmagnetic tunneling barrier layer 31. The third ferromagnetic layer 30 is stacked with the first stacked unit SB1 in the stacking direction SD1. The direction of the magnetization of the third ferromagnetic layer 30 is changeable. The width of the third ferromagnetic layer 30 (the length in a direction perpendicular to the stacking direction SD1) is, for example, not more than 35 nanometers (nm). For example, in the case where the configuration of the third ferromagnetic layer 30 when projected onto the X-Y plane is a circle, the diameter of the third ferromagnetic layer 30 is not more than 35 nm. The thickness of the third ferromagnetic layer 30 (the length in the stacking direction SD1) is, for example, not less than 0.5 nm and not more than 3.5 nm.

The nonmagnetic tunneling barrier layer 31 contacts the third ferromagnetic layer 30 which is stacked with the first stacked unit SB1 in the stacking direction SD1. For example, the nonmagnetic tunneling barrier layer 31 includes an insulator and is a nonmagnetic layer in which a current (a tunneling current) flows due to tunneling when a voltage is applied. The thickness of the nonmagnetic tunneling barrier layer 31 is, for example, not more than 2 nm. Thereby, the tunneling current flows in the nonmagnetic tunneling barrier layer 31 when the voltage is applied. The third ferromagnetic layer 30 has an interface that directly contacts the nonmagnetic tunneling barrier layer 31 including the insulator.

In this example, the second stacked unit SB2 further includes a fourth ferromagnetic layer 40. The fourth ferromagnetic layer 40 is stacked in the third ferromagnetic layer 30 and the stacking direction SD1. The direction of the magnetization of the fourth ferromagnetic layer 40 is substantially fixed. The nonmagnetic tunneling barrier layer 31 is provided between the third ferromagnetic layer 30 and the fourth ferromagnetic layer 40.

In this example, the stacked body SB0 further includes a second nonmagnetic layer 20n. The second nonmagnetic layer 20n is provided between the first stacked unit SB1 and the second stacked unit SB2. The second nonmagnetic layer 20n is, for example, a spin quenching layer that quenches the spin polarization of the electrons that flow.

In this example, the magnetic memory element 110 further includes a first conductive layer 81 and a second conductive layer 82. The first stacked unit SB1 is disposed between the first conductive layer 81 and the second conductive layer 82. The second stacked unit SB2 is disposed between the first stacked unit SB1 and the second conductive layer 82. The first conductive layer 81 is electrically connected to the first stacked unit SB1. In this example, the first conductive layer 81 is electrically connected to the second ferromagnetic layer 20. The second conductive layer 82 is electrically connected to the second stacked unit SB2. In this example, the second conductive layer 82 is electrically connected to the third ferromagnetic layer 30.

The first conductive layer 81 and the second conductive layer 82 are electrically connected to the control unit 550. The magnetic memory element 110 is connected directly or indirectly to the control unit 550 via the first conductive layer 81 and the second conductive layer 82. The first conductive layer 81 and the second conductive layer 82 may be considered to be separate from the magnetic memory element 110.

According to the nonvolatile memory device 610 according to the embodiment, a nonvolatile memory device in which misoperations are suppressed can be provided. For example, even in the case where the width of the magnetic memory element 110 is not more than 35 nm, the magnetization reversal of the second ferromagnetic layer 20 can be assisted in bidirectional programming. Thereby, for example, misoperations in the programming are suppressed. Also, the value of the current in the programming can be reduced.

Examples of configurations and operations of the magnetic memory element 110 will now be described. The following description is applicable not only to the magnetic memory element 110 but also to other magnetic memory elements according to the embodiment described below.

In the magnetic memory element 110, spin-polarized electrons are caused to act on the second ferromagnetic layer 20 by causing a current to flow in the first stacked unit SB1 and the second stacked unit SB2 in the stacking direction SD1. Also, in the magnetic memory element 110, a magnetic field generated by the procession of the magnetization of the third ferromagnetic layer 30 is caused to act on the second ferromagnetic layer 20. Thereby, the direction of the magnetization of the second ferromagnetic layer 20 is determined by the orientation of the current.

The first ferromagnetic layer 10 functions as, for example, a first fixed magnetic layer. For example, the magnetization of the first ferromagnetic layer 10 is fixed in a direction substantially perpendicular to the film surface. For example, the direction of the magnetization of the first ferromagnetic layer 10 is a direction substantially perpendicular to the film surface.

For example, the easy magnetization axis of the second ferromagnetic layer 20 is in a direction substantially perpendicular to the film surface. For example, the direction of the magnetization of the second ferromagnetic layer 20 is in a direction substantially perpendicular to the film surface. The magnetization of the second ferromagnetic layer 20 is relatively easily reversible. The second ferromagnetic layer 20 performs the role of storing data. For example, the second ferromagnetic layer 20 functions as a magnetic storage layer.

The first nonmagnetic layer 10n functions as a first spacer layer. In the case where the first nonmagnetic layer 10n is a tunneling barrier layer based on an insulating material, the first stacked unit SB1 including the first ferromagnetic layer 10, the first nonmagnetic layer 10n, and the second ferromagnetic layer 20 has, for example, a MTJ (Magnetic Tunnel Junction) structure.

In the third ferromagnetic layer 30, for example, the magnetization component projected onto the stacking direction SD1 is larger than the magnetization component projected onto a direction perpendicular to the stacking direction SD1. It is desirable for the easy magnetization axis of the third ferromagnetic layer 30 to be slightly tilted away from being substantially perpendicular to the film surface. The third ferromagnetic layer 30 performs the role of generating a high frequency magnetic field in the programming. The third ferromagnetic layer 30 functions as, for example, a magnetization rotation layer (a generation layer).

The fourth ferromagnetic layer 40 functions as, for example, a second fixed magnetic layer. The direction of the magnetization of the fourth ferromagnetic layer 40 is fixed in, for example, a direction substantially perpendicular to the film surface. For example, the direction of the magnetization of the fourth ferromagnetic layer 40 is a direction substantially perpendicular to the film surface. The nonmagnetic tunneling barrier layer 31 functions as a second spacer layer.

The first ferromagnetic layer 10, the second ferromagnetic layer 20, the third ferromagnetic layer 30, and the fourth ferromagnetic layer 40 may include, for example, perpendicular magnetization films.

FIG. 2A and FIG. 2B are schematic views showing the magnetization.

FIG. 2A shows the magnetization of a perpendicular magnetization film. FIG. 2B shows the magnetization of an in-plane magnetization film.

As shown in FIG. 2A and FIG. 2B, one direction perpendicular to the stacking direction SD1 is taken as an in-plane direction SD2. The in-plane direction SD2 is a direction in the X-Y plane. An in-plane magnetization component 72b of a magnetization 72 is the component of the magnetization 72 projected onto the X-Y plane. The in-plane magnetization component 72b is parallel to the in-plane direction SD2. A perpendicular magnetization component 72a of the magnetization 72 is the component of the magnetization 72 projected onto the Z-axis direction. The perpendicular magnetization component 72a is parallel to the stacking direction SD1.

As shown in FIG. 2A, the perpendicular magnetization component 72a of the perpendicular magnetization film has a magnetization state that is larger than that of the in-plane magnetization component 72b. Regarding the operating characteristics, it is desirable for the direction of the magnetization of the perpendicular magnetization film to be substantially perpendicular to the film surface.

As shown in FIG. 2B, the in-plane magnetization component 72b of the in-plane magnetization film has a magnetization state that is larger than that of the perpendicular magnetization component 72a. Regarding the operating characteristics, it is desirable for the direction of the magnetization of the in-plane magnetization film to be substantially parallel to the film surface.

For convenience of description, the direction from the first stacked unit SB1 toward the second stacked unit SB2 is called "up" or "upward." The direction from the second stacked unit SB2 toward the first stacked unit SB1 is called "down" or "downward."

As described above, the direction of the magnetization of the first ferromagnetic layer 10 is substantially fixed. The direction of the magnetization of the fourth ferromagnetic layer 40 is substantially fixed.

In the magnetic memory element 110 as shown in FIG. 1, the direction of the magnetization of the first ferromagnetic layer 10 is upward; and the direction of the magnetization of the fourth ferromagnetic layer 40 also is upward. However, various modifications of the direction of the magnetization of the first ferromagnetic layer 10 and the direction of the magnetization of the fourth ferromagnetic layer 40 are possible. For example, both the direction of the magnetization of the first ferromagnetic layer 10 and the direction of the magnetization of the fourth ferromagnetic layer 40 may be downward; or one selected from the direction of the magnetization of the first ferromagnetic layer 10 and the direction of the magnetization of the fourth ferromagnetic layer 40 may be upward and the other may be downward.

In the magnetic memory element 110, an electron current can be caused to flow in the first stacked unit SB1 and the second stacked unit SB2 via, for example, the first conductive layer 81 and the second conductive layer 82. The electron current is a flow of electrons. The electron current flows downward when the current flows upward.

The magnetization of the third ferromagnetic layer 30 which is the magnetic field source processes when the electron current is caused to flow in a direction perpendicular to the film surface. Thereby, a rotating magnetic field (a high frequency magnetic field) is generated. The high frequency magnetic field has a component in a direction perpendicular to the magnetization of the second ferromagnetic layer 20 (a component in the direction of the hard magnetization axis of the second ferromagnetic layer 20). Accordingly, at least a portion of the high frequency magnetic field generated by the third ferromagnetic layer 30 is applied in the direction of the hard magnetization axis of the second ferromagnetic layer 20. When the high frequency magnetic field generated by the third ferromagnetic layer 30 is applied in the direction of the hard magnetization axis of the second ferromagnetic layer 20, the magnetization of the second ferromagnetic layer 20 becomes extremely easy to reverse.

In the magnetic memory element 110, the direction of the magnetization of the second ferromagnetic layer 20 can be controlled by causing the electron current to flow in the first stacked unit SB1 and the second stacked unit SB2. Specifically, the orientation of the magnetization of the second ferromagnetic layer 20 can be reversed by changing the orientation (the polarity) in which the electron current flows. In the case where information is stored, for example, "0" or "1" is allotted according to the direction of the magnetization of the second ferromagnetic layer 20. The magnetic memory element 110 has a first state, and a second state that is different from the first state. The first state and the second state respectively correspond to the two different directions of the magnetization of the second ferromagnetic layer 20.

As described above, it is favorable for the width (the diameter) of the third ferromagnetic layer 30 to be not more than 35 nm. In the case where the width of the third ferromagnetic layer 30 is greater than 35 nm, for example, a vortex (a closure domain) occurs when the magnetization of the third ferromagnetic layer 30 processes. For example, the occurrence of the vortex can be suppressed by setting the equivalent circular diameter of the cross-sectional configuration of the third ferromagnetic layer 30 to be not more than 35 nm and the thickness of the third ferromagnetic layer 30 to be not less than 0.5 nm and not more than 3.5 nm. Thereby, for example, the magnetization reversal of the second ferromagnetic layer 20 can be assisted by causing the high frequency magnetic field generated by the third ferromagnetic layer 30 to act more appropriately on the magnetization reversal of the second ferromagnetic layer 20. In other words, a magnetic field intensity that is sufficient for the magnetization of the second ferromagnetic layer 20 to reverse can be obtained at the position of the second ferromagnetic layer 20.

It is desirable for the size of the horizontal cross-sectional configuration (the cross-sectional configuration when cut by a plane perpendicular to the stacking direction SD1) of the third ferromagnetic layer 30 to satisfy the relational expression of $r<0.419t^2-2.86t+19.8$, where the equivalent circular diameter of the horizontal cross-sectional configuration is R (nm), the value of half of R is r (=R/2) (nm), and the layer thickness is t (nm).

In the specification of the application, the equivalent circular diameter is the diameter of an imaginary circle having the same surface area as the surface area of the planar configuration of interest. For example, in the case where the horizontal cross-sectional configuration of the third ferromagnetic layer 30 is a circle, R is the diameter. In the case where the horizontal cross-sectional configuration of the third ferromagnetic layer 30 is an ellipse, R is the diameter of a circle having the same surface area as the surface area of the ellipse. In the case where the horizontal cross-sectional configuration of the third ferromagnetic layer 30 is a polygon, R is the diameter of a circle having the same surface area as the surface area of the polygon.

First, an example of the programming operation will be described as a specific example of the operations of the magnetic memory element 110.

FIG. 3A to FIG. 3D are schematic views showing operations of the nonvolatile memory device according to the first embodiment.

These drawings show states of the first stacked unit SB1 and the second stacked unit SB2 in the programming operation of the magnetic memory element 110.

FIG. 3A shows the state in which an electron current 60 is caused to start to flow from the first ferromagnetic layer 10 toward the second ferromagnetic layer 20. Namely, in FIG. 3A, the electron current 60 is caused to flow downward. FIG. 3B shows the state in which the flow of the electron current 60 from the first ferromagnetic layer 10 toward the second ferromagnetic layer 20 is stopped (the state in which the magnetization has reversed). FIG. 3C shows the state in which the electron current 60 is caused to start to flow from the second ferromagnetic layer 20 toward the first ferromagnetic layer 10. Namely, in FIG. 3C, the electron current 60 is caused to flow upward. FIG. 3D shows the state in which the flow of the electron current 60 from the second ferromagnetic layer 20 toward the first ferromagnetic layer 10 is stopped (the state in which the magnetization has reversed). FIG. 3C and FIG. 3D correspond to the cases shown in FIG. 3A and FIG. 3B where the orientation of the electron current 60 is reversed.

In the programming operation, the programming operation of the second ferromagnetic layer 20 is implemented by causing the electron current 60 to flow across the film surface of the first ferromagnetic layer 10 and the film surface of the second ferromagnetic layer 20. Here, the case is described where the magnetoresistance effect via the first nonmagnetic layer 10n is the normal type.

In the normal-type magnetoresistance effect, the electrical resistance when the magnetizations of the magnetic layers on two sides of the nonmagnetic layer are parallel to each other is lower than the electrical resistance when the magnetizations are antiparallel. In the case of the normal type, the electrical resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when the magnetization of the first ferromagnetic layer 10 is antiparallel to the magnetization of the second ferromagnetic layer 20.

As shown in FIG. 3A, the electrons passing through the first ferromagnetic layer 10, which has a magnetization 11 in a direction substantially perpendicular to the film surface, have spins in the same direction as the magnetization 11 of the first ferromagnetic layer 10. When the electrons flow into the second ferromagnetic layer 20, the angular momentum of the spins is transferred to the second ferromagnetic layer 20 and acts on a magnetization 12 of the second ferromagnetic layer 20. In other words, a so-called spin-transfer torque acts.

In the example, in the case where the electron current 60 is caused to flow downward, the orientation of a magnetization 13 of the third ferromagnetic layer 30 is set beforehand to be upward. The electrons passing through the nonmagnetic tunneling barrier layer 31 that have spins with the same orientation as a magnetization 14 of the fourth ferromagnetic layer 40 (in FIG. 3A, upward) pass through the fourth ferromagnetic layer 40. On the other hand, the electrons having spins with a reverse orientation with respect to the magnetization 14 of the fourth ferromagnetic layer 40 (in FIG. 3A, downward) are reflected at the interface between the fourth ferromagnetic layer 40 and the nonmagnetic tunneling barrier layer 31. The angular momentum of the spins of the reflected electrons is transferred to the third ferromagnetic layer 30 and acts on the magnetization 13 of the third ferromagnetic layer 30. Thereby, the magnetization 13 of the third ferromagnetic layer 30 processes; and a high frequency magnetic field is generated. Also, the spin polarization of the electrons passing through the fourth ferromagnetic layer 40 is quenched by passing through the second nonmagnetic layer 20n.

As shown in FIG. 3B, the magnetization 12 of the second ferromagnetic layer 20 reverses due to the action of the spin-transfer torque and the action of the high frequency magnetic field to have the same orientation as the magnetization 11 of the first ferromagnetic layer 10. The orientation is upward in FIG. 3B and is, for example, one direction parallel to the stacking direction SD1. For example, "0" is allotted to the state of the second ferromagnetic layer 20 having the magnetization 12 of this orientation. In the magnetic memory element 110, for example, the state in which the orientation of the magnetization 12 of the second ferromagnetic layer 20 is upward corresponds to the first state.

As shown in FIG. 3C, the electrons passing through the first nonmagnetic layer 10n that have spins with the same orientation as the magnetization 11 of the first ferromagnetic layer 10 (in FIG. 3C, upward) pass through the first ferromagnetic layer 10. On the other hand, the electrons having spins that are reversely oriented with respect to the magnetization 11 of the first ferromagnetic layer 10 (in FIG. 3C, downward) are reflected at the interface between the first ferromagnetic layer 10 and the first nonmagnetic layer 10n. The angular momentum of the spins of the reflected electrons is transferred to the second ferromagnetic layer 20 and acts on the magnetization 12 of the second ferromagnetic layer 20.

In the example, in the case where the electron current 60 is caused to flow upward, the orientation of the magnetization 13 of the third ferromagnetic layer 30 is set beforehand to be downward. The electrons passing through the fourth ferromagnetic layer 40 that have the upward magnetization 14 have spins in the same direction as the magnetization 14 of the fourth ferromagnetic layer 40. When the electrons flow into the third ferromagnetic layer 30, the angular momentum of the spins is transferred to the third ferromagnetic layer 30 and acts on the magnetization 13 of the third ferromagnetic layer 30. Thereby, the magnetization 13 of the third ferromagnetic layer 30 processes; and a high frequency magnetic field is generated. Also, the spin polarization of the electrons passing through the first ferromagnetic layer 10 is quenched by passing through the second nonmagnetic layer 20n.

As shown in FIG. 3D, the magnetization 12 of the second ferromagnetic layer 20 reverses due to the action of the spin-transfer torque and the action of the high frequency magnetic field to be reversely oriented with respect to the magnetization 11 of the first ferromagnetic layer 10 (in FIG. 3D, downward). For example, "1" is allotted to the state of the second ferromagnetic layer 20 having the magnetization 12 of this orientation. In the magnetic memory element 110, for example, the state in which the orientation of the magnetization 12 of the second ferromagnetic layer 20 is downward corresponds to the second state.

Based on such actions, "0" and "1" are appropriately allotted respectively to the different states of the second ferromagnetic layer 20. Thereby, the programming of the magnetic memory element 110 is implemented.

On the other hand, in the case where the magnetoresistance effect is the reverse type, the electrical resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when the magnetization of the first ferromagnetic layer 10 is antiparallel to the magnetization of the second ferromagnetic layer 20. The programming operation of the reverse type is similar to the case of the normal type.

In the example, for example, the first state is "0;" and the second state is "1." The first state may be "1;" and the second state may be "0." The first state and the second state are not limited to "0" or "1" and may be other states. The number of states provided in the magnetic memory element 110 may be three or more. In other words, the magnetic memory element 110 may be a multi-bit memory element.

The setting of the first state or the second state is implemented by the control unit 550. For example, the setting of the first state corresponds to programming; and the setting of the second state corresponds to erasing. The setting of the second state may correspond to programming; and the setting of the first state may correspond to erasing.

The control unit 550 implements a first operation of causing the magnetic memory element 110 to be in the first state. In the first operation, for example, the direction of the magnetization 12 of the second ferromagnetic layer 20 is set to be in a first direction. The first operation includes a first preliminary operation and a first setting operation. The first preliminary operation includes changing the direction of the magnetization 13 of the third ferromagnetic layer 30 to a second direction. The first setting operation is implemented after the first preliminary operation. The first setting operation includes setting the direction of the magnetization 12 of the second ferromagnetic layer 20 to be the first direction. In the example, the first operation is the operation shown in FIG. 3A and FIG. 3B. In other words, the first direction is upward; and the second direction is upward.

The control unit 550 further implements a second operation of causing the magnetic memory element 110 to be in a second state. In the second operation, the direction of the magnetization 12 of the second ferromagnetic layer 20 is changed to a third direction. The second operation includes a second preliminary operation and a second setting operation. The second preliminary operation includes changing the direction of the magnetization 13 of the third ferromagnetic layer 30 to a fourth direction. The second setting operation is implemented after the second preliminary operation. The second setting operation includes setting the direction of the magnetization 12 of the second ferromagnetic layer 20 to be in the third direction. In the example, the second operation is the operation shown in FIG. 3C and FIG. 3D. In other words, the third direction is downward; and the fourth direction is downward. The orientations of the first to fourth directions change according to, for example, the direction of the magnetization 11 of the first ferromagnetic layer 10 and the direction of the magnetization 14 of the fourth ferromagnetic layer 40.

An example of a read-out operation will now be described.

The sensing of the direction of the magnetization of the second ferromagnetic layer 20 of the magnetic memory element 110 is implemented by, for example, utilizing the magnetoresistance effect. In the magnetoresistance effect, the electrical resistance changes due to the relative orientations of the magnetizations of each layer. In the case where the magnetoresistance effect is utilized, a sense current is caused to flow between the first ferromagnetic layer 10 and the second ferromagnetic layer 20; and the magnetoresistance is measured. The value of the sense current is less than the value of a current corresponding to the electron current 60 caused to flow when programming (when storing).

FIG. 4A and FIG. 4B are schematic views showing an operation of the nonvolatile memory device according to the first embodiment.

These drawings show the state of the first stacked unit SB1 of the magnetic memory element 110 in the read-out operation. The second stacked unit SB2, the first conductive layer 81, the second conductive layer 82, and the second nonmagnetic layer 20n are not shown in these drawings.

FIG. 4A shows the case where the direction of the magnetization 11 of the first ferromagnetic layer 10 is the same as the direction of the magnetization 12 of the second ferromagnetic layer 20. FIG. 4B shows the case where the direction of the magnetization 11 of the first ferromagnetic layer 10 is antiparallel (reversely oriented) to the direction of the magnetization 12 of the second ferromagnetic layer 20.

As shown in FIG. 4A and FIG. 4B, a sense current 61 is caused to flow in the first stacked unit SB1; and the electrical resistance is sensed.

In the case of the normal magnetoresistance effect, the resistance in the state of FIG. 4A is lower than the resistance in the state of FIG. 4B. In the case of the reverse magnetoresistance effect, the resistance in the state of FIG. 4A is higher than the resistance in the state of FIG. 4B.

It is possible to read a record of binary data by associating the multiple states having mutually different resistances with "0" and "1," respectively. The orientation of the sense current 61 may be reversely oriented with respect to the direction shown in FIG. 4A and FIG. 4B.

In the magnetic memory element 110 as recited above, the second stacked unit SB2 functions as a magnetic field source. The first stacked unit SB1 functions as a magnetic storage unit. Hereinbelow, the second stacked unit SB2 may be called a magnetic field source or a STO (Spin Torque Oscillator). On the other hand, the first stacked unit SB1 may be called a magnetic storage unit or a MTJ.

As recited above, the programming to the second ferromagnetic layer 20 which is the storage layer of the MTJ element is performed by spin torque programming. In such a magnetic memory element 110, it is desirable for the width of the magnetic memory element 110 to be, for example, not more than 35 nm due to the need for higher bit density. The width of the magnetic memory element 110 is, for example, the length of the magnetic memory element 110 in the X-axis direction or the Y-axis direction. In the case where the configuration of the magnetic memory element 110 projected onto the X-Y plane is a circle or an ellipse, the width of the magnetic memory element 110 is the diameter (the major diameter) of the magnetic memory element 110.

The inventor of the application discovered that the thermal agitation resistance can be maintained in the case where the width of the magnetic memory element 110 is not more than 35 nm by the second ferromagnetic layer 20, etc., including a material having a high perpendicular magnetic anisotropy. In such a case, it is necessary for the high frequency magnetic field generated by the second stacked unit SB2 (the STO) to be, for example, not less than 20 GHz.

In the magnetic memory element 110, for example, a magnetic field of 20 GHz or more can be generated by a perpendicular magnetization film being included in the third ferromagnetic layer 30. However, the case where the third ferromagnetic layer 30 includes a perpendicular magnetization film is problematic in that the STO is oscillated by only unidirectional current.

To cause oscillations in a perpendicular magnetization film by a bidirectional current, it is necessary to reverse the orientation of the magnetization of the third ferromagnetic layer 30 or the fourth ferromagnetic layer 40 according to the current direction. In the magnetic memory element 110 as shown in FIG. 1, it is possible to reverse the orientation of the magnetization of the third ferromagnetic layer 30 by a perpendicular magnetization film being included in the third ferromagnetic layer 30, by using a structure in which the third ferromagnetic layer 30 contacts the nonmagnetic tunneling barrier layer 31, and by applying a pulse voltage having a fast rising time. For example, the rising time of the pulse voltage is less than 1 ns (nanoseconds) (less than 1 nanoseconds and not less than 10 picoseconds). Thereby, the orientation of the magnetization of the third ferromagnetic layer 30 can be changed by the application of the pulse voltage.

A current that causes the procession of the magnetization of the third ferromagnetic layer 30 by spin-transfer torque is caused to flow after the orientation of the magnetization of the third ferromagnetic layer 30 is changed. Thereby, a magnetic field of 20 GHz or more can be generated by a bidirectional current.

Operations of the second stacked unit SB2 in the programming will now be described.

FIG. 5A to FIG. 5C are schematic views showing the operation of the magnetic memory element according to the first embodiment.

FIG. 5A to FIG. 5C show a magnetization reversal method of the third ferromagnetic layer 30 by applying a pulse voltage. To simplify the description, only the second stacked unit SB2 is shown in FIG. 5A to FIG. 5C. FIG. 5A shows the second stacked unit SB2 prior to applying the pulse voltage. FIG. 5B shows the third ferromagnetic layer 30 prior to applying the pulse voltage. FIG. 5C shows the third ferromagnetic layer 30 when applying the pulse voltage. In FIG. 5A and FIG. 5B, the direction of the component of the magnetization 13 of the third ferromagnetic layer 30 projected onto the stacking direction SD1 is upward.

As shown in FIG. 5A and FIG. 5B, in the state prior to applying the pulse voltage (the state in which the pulse voltage is not applied), the component of the magnetization 13 of the third ferromagnetic layer 30 projected onto the stacking direction SD1 is larger than the component of the magnetization 13 of the third ferromagnetic layer 30 projected onto the in-plane direction SD2. When a pulse voltage having a short rising time is applied to the magnetic memory element 110, the anisotropic magnetic field of the direction in the stacking direction SD1 of the magnetization 13 becomes smaller than the effective magnetic field of the magnetization 13 in the direction in the in-plane direction SD2. As a result, an easy magnetization axis EA of the third ferromagnetic layer 30 tilts toward the in-plane direction SD2 side not less than 45 degrees from the stacking direction SD1; and the magnetization 13 processes with the easy magnetization axis EA as an axis. As a result, in the procession, the component of the magnetization 13 projected onto the stacking direction SD1 repeats the upward state and the downward state.

FIG. 6A to FIG. 6E are schematic views showing the operation of the magnetic memory element according to the first embodiment.

FIG. 6A to FIG. 6E show a method for determining the magnetization direction of the third ferromagnetic layer 30. To simplify the description, only the second stacked unit SB2 is shown in FIG. 6A to FIG. 6E. In the procession in FIG. 6A, FIG. 6B, and FIG. 6D, the motion of the magnetization 13 of the third ferromagnetic layer 30 is considered to be inside a sphere SP. The sphere SP is, for example, a virtual sphere having a center CT disposed on an axis PA of the procession of the magnetization 13.

In the procession as shown in FIG. 6A, the state in which the magnetization 13 of the third ferromagnetic layer 30 is in the upper hemisphere of the sphere SP and the state in which the magnetization 13 of the third ferromagnetic layer 30 is in the lower hemisphere of the sphere SP are repeated. Here, the upper hemisphere is the portion of the sphere SP on the upper side of the plane parallel to the X-Y plane that includes the center CT. The lower hemisphere is the portion of the sphere SP on the lower side of the plane parallel to the X-Y plane that includes the center CT. In the example, the axis PA is a line in the plane parallel to the X-Y plane that includes the center CT. In the example, an origin VO of the magnitization vector of the magnetization 13 is taken to be the center CT. In other words, in the procession, the magnetization 13 crosses the plane parallel to the X-Y plane that includes the center CT.

To make the parallel magnitization state as shown in FIG. 6B and FIG. 6C, the pulse voltage is switched OFF in the state in which the magnetization 13 is in the upper hemisphere. When the pulse voltage is switched OFF, the effect of the component in the stacking direction SD1 of the magnetization 13 becomes strong; and the magnetization 13 relaxes upward. As a result, the magnetization 13 of the third ferromagnetic layer 30 and the upward magnetization 14 of the fourth ferromagnetic layer 40 are in the parallel magnetization state.

To make the antiparallel magnetization state as shown in FIG. 6D and FIG. 6E, it is sufficient to switch the pulse voltage OFF in the state in which the magnetization 13 is in the lower hemisphere. In such a case, the magnetization 13 of the third ferromagnetic layer 30 relaxes downward. Thereby, the magnetization 13 and the magnetization 14 are in the antiparallel magnetization state.

FIG. 7A to FIG. 7D are graphs showing the operation of the nonvolatile memory device according to the first embodiment.

FIG. 7A to FIG. 7D show a more detailed description of the method for controlling the magnetization by the pulse voltage.

Figure 7A:
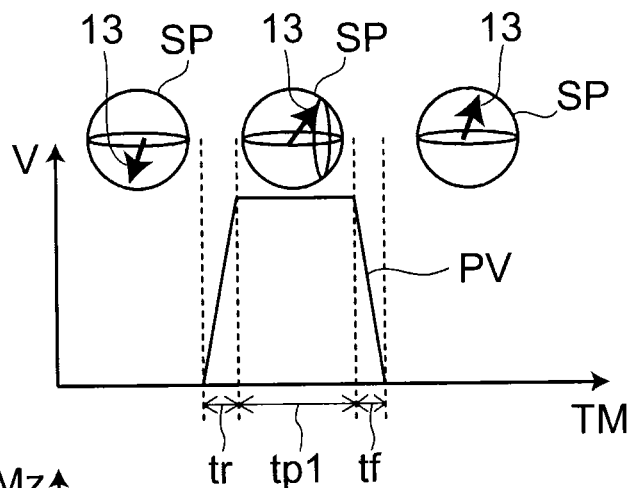
FIG. 7A to FIG. 7D are graphs showing an operation of the nonvolatile memory device according to the first embodiment.
Figure 7B:
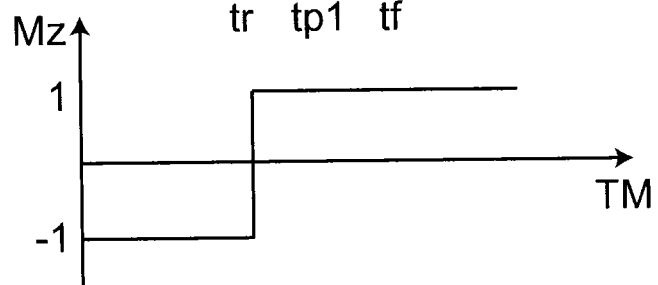
Figure 7C:
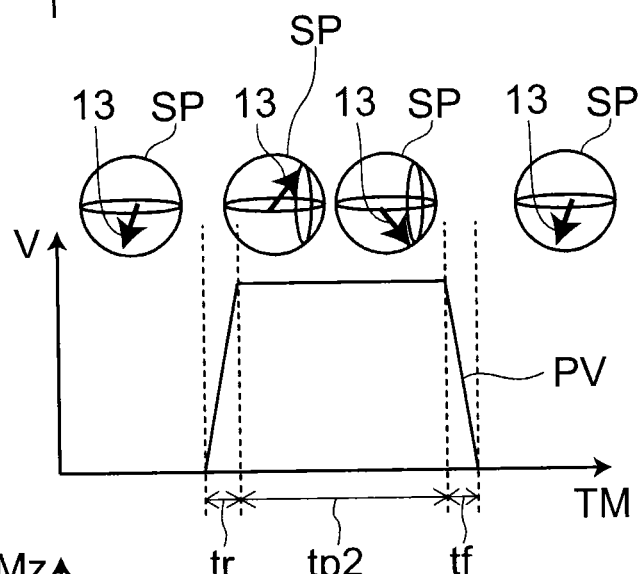
Figure 7D:
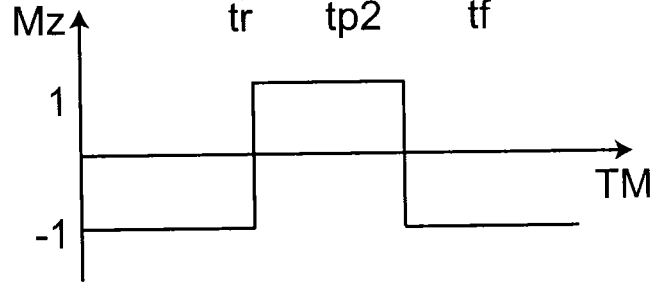

In FIG. 7A to FIG. 7D, the horizontal axis is a time TM. In FIG. 7A and FIG. 7C, the vertical axis is the value of the pulse voltage that is applied. In FIG. 7B and FIG. 7D, the vertical axis is a normalized value Mz that is normalized such that the state in which the magnetization 13 is upward is "1" and the state in which the magnetization 13 is downward is "−1." Focusing on the magnetization 13 of the third ferromagnetic layer 30, the magnetization state is illustrated as a spherical surface in FIG. 7A and FIG. 7C.

As shown in FIG. 7A and FIG. 7B, for example, in the case where the initial state is the state in which the magnetization 13 is downward, a pulse voltage PV is applied. The pulse voltage PV has a rising time tr, a first duration tp1, and a trailing time tf. The first duration tp1 is, for example, the time between the end point of the rising time tr and the start point of the trailing time tf. In the first duration tp1, the value of the pulse voltage PV may be substantially constant or may change.

In the case where the rising time tr is shorter than 1 ns, the magnetization projection component of the third ferromagnetic layer 30 in the in-plane direction SD2 becomes larger than the magnetization projection component of the third ferromagnetic layer 30 in the stacking direction SD1; and the magnetization 13 starts to process. The magnetization 13 relaxes upward when the pulse voltage PV is switched OFF when the magnetization 13 is in the upper hemisphere. In other words, Mz=1. A period Cp (seconds) of the procession of the magnetization 13 is determined by, for example, the magnitude of the effective magnetic field in the easy magnetization axis direction.

The first duration tp1 (seconds) is, for example, not less than 0.75 times (Cp/2)×(2n−1) and not more than 1.25 times (Cp/2)×(2n−1) (n being an integer not less than 1).

Thereby, the start state of Mz=−1 can be switched to the end state of Mz=1.

The rising time tr is set to be shorter than a relaxation time $\tau_{relax}$ of the change of the direction of the magnetization 13 of the third ferromagnetic layer 30. Thereby, the modulation of the magnetic anisotropy of the third ferromagnetic layer 30 can be caused to act more effectively. In other words, the pulse voltage PV for which tr<$\tau_{relax}$ is applied. Thereby, the magnetization 13 of the third ferromagnetic layer 30 processes around an axis that is in a direction that is different from the second direction and the fourth direction. For example, $\tau_{relax}$ can be determined using Formula (1).

[Formula 1]

$$\tau_{relax} = \frac{1}{\alpha \gamma H_{eff}} \quad (1)$$

The Gilbert damping constant α, a gyromagnetic constant γ (Hz/Oe (hertz/oersted)), and an effective magnetic field $H_{eff}$ (Oe) in the easy magnetization axis direction are used in Formula (1).

The effective magnetic field $H_{eff}$ can be determined, for example, using the formula $H_{eff}=H_u+H_{demag}+H_{ext}$. The magneto-crystalline anisotropy $H_u$ of the stacking direction SD1, the demagnetizing field $H_{demag}$ (Oe), and the external magnetic field $H_{ext}$ (Oe) are used in this Formula.

In the case where the initial state is the state in which the magnetization 13 is downward, the method for making the antiparallel magnetization state is as follows. In such a case, the pulse voltage PV may not be applied because it is unnecessary to change the magnetization direction.

In the case where the pulse voltage PV is applied as shown in FIG. 7C and FIG. 7D, the pulse voltage PV has the rising time tr, a second duration tp2, and the trailing time tf. The second duration tp2 is selected such that the pulse voltage PV is switched OFF when the magnetization 13 is in the lower hemisphere. Thereby, the magnetization 13 relaxes downward. In other words, Mz=−1.

The second duration tp2 (seconds) is, for example, not less than 0.75 times (Cp/2)×2(n) and not more than 1.25 times (Cp/2)×2(n) (n being an integer not less than 1).

Thereby, the start state of Mz=−1 can be switched to the end state of Mz=−1.

A current flows from the first ferromagnetic layer 10 to the second ferromagnetic layer 20 when the pulse voltage is applied to the first ferromagnetic layer 10 (the reference layer), the first nonmagnetic layer 10n, and the second ferromagnetic layer 20 (the storage layer). At this time, the electrons passing through the first ferromagnetic layer 10 have spins in the same direction as the magnetization 11 of the first ferromagnetic layer 10. When the electrons flow into the second ferromagnetic layer 20, the angular momentum of the spins is transferred to the second ferromagnetic layer 20 and acts on the magnetization 12 of the second ferromagnetic layer 20. In other words, a so-called spin-transfer torque acts. The reverse of the magnetization direction of the third ferromagnetic layer 30 does not utilize spin-transfer torque. Herein, the modulation of the magnetic anisotropy occurring in the voltage application is utilized. This can be confirmed because the coercive force (Hc) and/or the resonance frequency of the magnetic memory element 110 change in the voltage application. The polarity of the pulse voltage applied to cause the magnetization reversal of the third ferromagnetic layer 30 according to the embodiment may be in one direction.

Figure 8A:
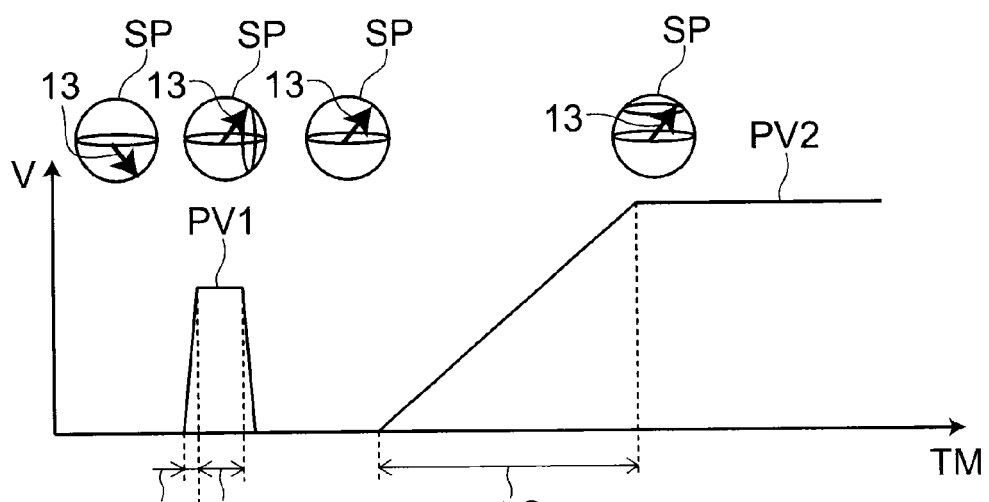
FIG. 8A and FIG. 8B are graphs showing an operation of the nonvolatile memory device according to the first embodiment.
Figure 8B:
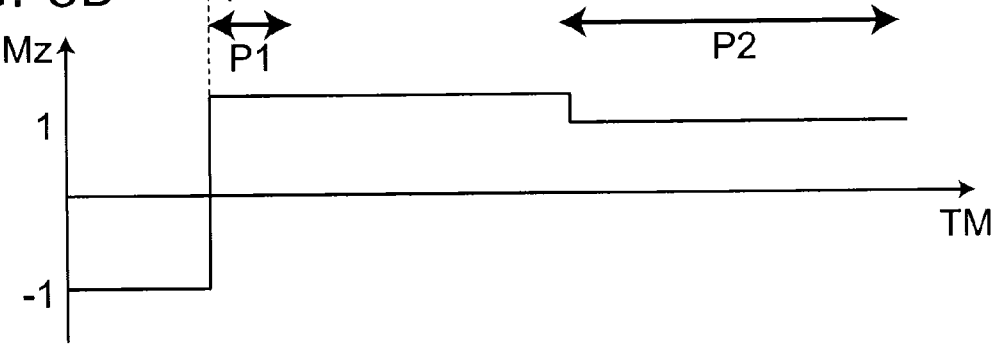

FIG. 8A and FIG. 8B are graphs showing the operation of the nonvolatile memory device according to the first embodiment.

In FIG. 8A and FIG. 8B, the horizontal axis is the time TM. The vertical axis of FIG. 8A is the value of the pulse voltage that is applied. The vertical axis of FIG. 8B is the normalized value Mz.

In FIG. 8A and FIG. 8B, the orientation of the magnetization 13 in the start state is downward (Mz=−1). A first pulse voltage PV1 having a first rising time tr1 is applied in this state. The first rising time tr1 is not more than $\tau_{relax}$. The first rising time tr1 is, for example, less than 1 ns (e.g., less than 1 nanoseconds and not less than 10 picoseconds). The duration (the pulse width) of the first pulse voltage PV1 is set to be the first duration tp1 recited above. Thereby, the magnetization 13 of the third ferromagnetic layer 30 can be reversed and the orientation of the magnetization 13 can be upward in a first interval P1 which is the interval of the application of the first pulse voltage PV1. Thus, the magnetization 13 of the third ferromagnetic layer 30 becomes oriented in the second direction when the first pulse voltage PV1 ends.

A second pulse voltage PV2 having a second rising time tr2 is applied after the application of the first pulse voltage PV1. The second rising time tr2 is longer than $\tau_{relax}$. In other words, the second rising time tr2 is longer than the first rising time tr1. Thereby, in a second interval P2 which is the interval of the application of the second pulse voltage PV2, the magnetization 13 of the third ferromagnetic layer 30 processes and a high frequency magnetic field is generated simultaneously by the spin-transfer torque. The magnetization reversal of the second ferromagnetic layer 20 is assisted by the high frequency magnetic field. Thereby, it is possible to reduce the value of the current to reverse the magnetization 12 of the second ferromagnetic layer 20.

Figure 9A:
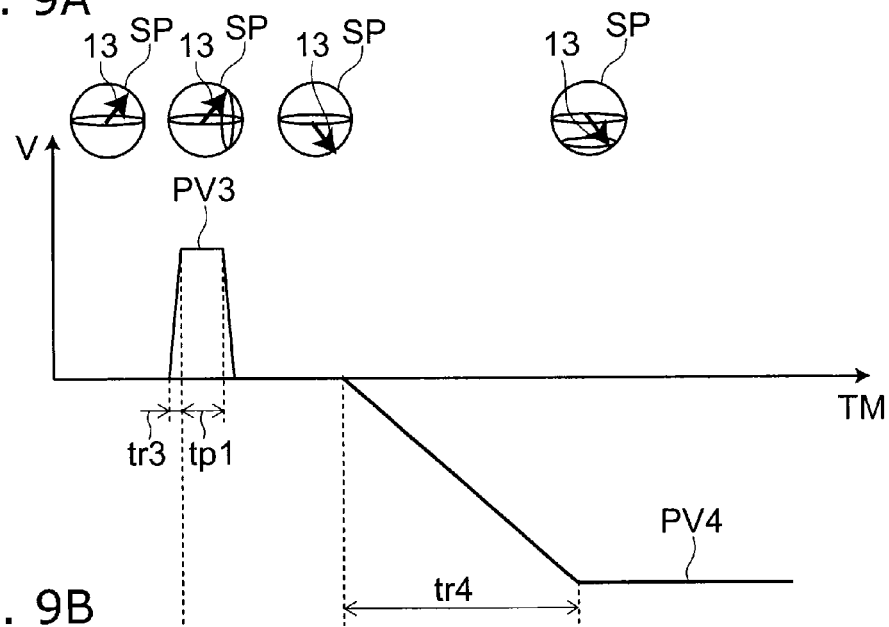
FIG. 9A and FIG. 9B are graphs showing an operation of the nonvolatile memory device according to the first embodiment.
Figure 9B:
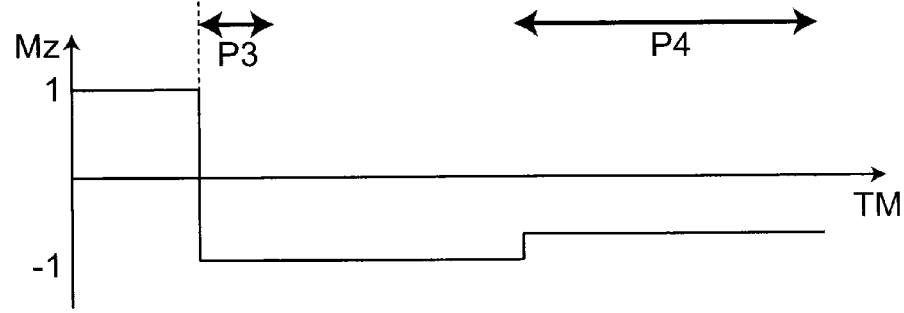

FIG. 9A and FIG. 9B are graphs showing the operation of the nonvolatile memory device according to the first embodiment.

In FIG. 9A and FIG. 9B, the horizontal axis is the time TM. The vertical axis of FIG. 9A is the value of the pulse voltage that is applied. The vertical axis of FIG. 9B is the normalized value Mz.

In FIG. 9A and FIG. 9B, the orientation of the magnetization 13 in the start state is upward (Mz=1). A third pulse voltage PV3 having a third rising time tr3 is applied in this state. The third rising time tr3 is not more than $\tau_{relax}$. The third rising time tr3 is, for example, less than 1 ns (e.g., less than 1 nanoseconds and not less than 10 picoseconds). The duration of the third pulse voltage PV3 is set to be the first duration tp1. Thereby, the magnetization 13 of the third ferromagnetic layer 30 can be reversed and the orientation of the magnetization 13 can be downward in a third interval P3 which is the interval of the application of the third pulse voltage PV3.

A fourth pulse voltage PV4 having a fourth rising time tr4 is applied after the application of the third pulse voltage PV3. The fourth rising time tr4 is longer than $\tau_{relax}$. In other words, the fourth rising time tr4 is longer than the third rising time tr3. The polarity of the fourth pulse voltage PV4 is different from the polarity of the second pulse voltage PV2. In the fourth pulse voltage PV4, a current having an orientation opposite to that of the second pulse voltage PV2 is caused to flow in the magnetic memory element 110. Thereby, the orientation of the magnetization 12 of the second ferromagnetic layer 20 reverses in a fourth interval P4 which is the interval of the application of the fourth pulse voltage PV4. In the example, for example, the orientation of the magnetization 12 of the second ferromagnetic layer 20 is changed from upward to downward.

The application of the first pulse voltage PV1 to the fourth pulse voltage PV4 is implemented by the control unit 550.

In the first preliminary operation, the control unit 550 changes the direction of the magnetization 13 of the third ferromagnetic layer 30 to the second direction by applying the first pulse voltage PV1 having the first rising time tr1 to the magnetic memory element 110. Then, in the first setting operation, the control unit 550 changes the direction of the magnetization 12 of the second ferromagnetic layer 20 to the first direction by applying the second pulse voltage PV2 having the second rising time tr2 to the magnetic memory element 110.

In the second preliminary operation, the control unit 550 changes the direction of the magnetization 13 of the third ferromagnetic layer 30 to the fourth direction by applying the third pulse voltage PV3 having the third rising time tr1 to the magnetic memory element 110. Then, in the second setting operation, the control unit 550 changes the direction of the magnetization 12 of the second ferromagnetic layer 20 to the third direction by applying the fourth pulse voltage PV4 having the fourth rising time tr4 to the magnetic memory element 110.

Thus, in the nonvolatile memory device 610 according to the embodiment, the control unit 550 applies the first to fourth pulse voltages PV1 to PV4 to the magnetic memory element 110. Thereby, for example, even in the case where the width of the magnetic memory element 110 is not more than 35 nm, the magnetization reversal of the second ferromagnetic layer 20 in bidirectional programming can be assisted; and misoperations during the programming can be suppressed.

An interconnect may be connected to the second nonmagnetic layer 20n; and the magnitude and orientation of the current between the first conductive layer 81 and the second nonmagnetic layer 20n may be different from the magnitude and orientation of the current between the second conductive layer 82 and the second nonmagnetic layer 20n in at least one selected from the programming operation and the read-out operation. This operation also includes the case where a current is not caused to flow. In other words, the first stacked unit SB1 and the second stacked unit SB2 may operate independently from each other.

The characteristics (e.g., the frequency) of the high frequency magnetic field generated by the third ferromagnetic layer 30 change due to the state of the magnetization of the second ferromagnetic layer 20. For example, the leakage magnetic field in the third ferromagnetic layer 30 changes based on the memory state (the direction of the magnetization 12) stored in the second ferromagnetic layer 20. This may be sensed as a change of the frequency of the high frequency magnetic field generated by the third ferromagnetic layer 30; or the memory state may be read.

Examples of the configurations of each layer of the magnetic memory element 110 will now be described. The following description is applicable to any magnetic memory element according to the embodiment.

It is favorable for the first ferromagnetic layer 10 and the second ferromagnetic layer 20 to include, for example, a metal material including at least one element selected from the group consisting of iron (Fe), cobalt (Co), nickel (Ni), manganese (Mn), and chrome (Cr). An alloy including the at least one selected from the group recited above and at least one metal selected from the group consisting of platinum (Pt), palladium (Pd), iridium (Ir), ruthenium (Ru), and rhodium (Rh) also may be used.

The compositions of the magnetic materials included in the first ferromagnetic layer 10 and the second ferromagnetic layer 20, the conditions of the heat treatment of the first ferromagnetic layer 10 and the second ferromagnetic layer 20, etc., are adjusted. Thereby, for example, the characteristics of the first ferromagnetic layer 10 and the second ferromagnetic layer 20 such as the magnetization amount, the magnetic anisotropy, etc., can be adjusted. The first ferromagnetic layer 10 and the second ferromagnetic layer 20 may include, for example, a rare earth-transition metal amorphous alloy such as TbFeCo, GdFeCo, etc. The first ferromagnetic layer 10 and the second ferromagnetic layer 20 may have, for example, a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the first ferromagnetic layer 10 and the second ferromagnetic layer 20 may include Co/Ru, Fe/Au, Ni/Cu, etc.

The first nonmagnetic layer 10n may include, for example, an insulating material that functions as a nonmagnetic tunneling barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

The first nonmagnetic layer 10n may include, for example, $Al_2O_3$, $SiO_2$, $MgO$, $AlN$, Ta—O, Al—Zr—O, $Bi_2O_3$, $MgF_2$, $CaF_2$, $SrTiO_3$, $AlLaO_3$, Al—N—O, Si—N—O, etc. The first nonmagnetic layer 10n may include, for example, a nonmagnetic semiconductor (ZnOx, InMn, GaN, GaAs, TiOx, Zn, Te, or one of these doped with a transition metal), etc.

It is desirable for the thickness of the first nonmagnetic layer 10n to have a value in the range of not less than about 0.2 nanometers (nm) and not more than about 2.0 nm. Thereby, for example, a resistance that is excessively high is prevented while ensuring uniformity of the insulating film.

The third ferromagnetic layer 30 may include, for example, a magnetic metal including at least one element selected from the group consisting of iron (Fe), cobalt (Co), nickel (Ni), manganese (Mn), and chrome (Cr).

The nonmagnetic tunneling barrier layer 31 may include, for example, the material of the nonmagnetic tunneling barrier layer described in regard to the first nonmagnetic layer 10n. The nonmagnetic tunneling barrier layer 31 may include, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, etc.

The nonmagnetic tunneling barrier layer 31 may be, for example, a nonmagnetic semiconductor (ZnOx, InMn, GaN, GaAs, TiOx, Zn, Te, or one of these doped with a transition metal).

The resistance value of the STO (the second stacked unit SB2) is set to correspond to, for example, the magnetoresistance effect of the magnetic memory element 110. The resistance value of the STO is reduced in the case where the magnetoresistance effect of the magnetic memory element 110 is small. For example, the resistance value of the STO is set to be a resistance value corresponding to 10% to 30% of the resistance change amount of the MTJ. In the case where the magnetoresistance effect of the magnetic memory element 110 is small, it is desirable for the thickness of the nonmagnetic tunneling barrier layer 31 to be, for example, a value in the range of not less than about 0.2 nm and not more than about 2.0 nm. Thereby, for example, the resistance value of the STO can be prevented from being excessively high while ensuring the uniformity of the film thickness of the nonmagnetic tunneling barrier layer 31. It is desirable for the nonmagnetic tunneling barrier layer 31 to include a high dielectric constant material. Thereby, the magnetic anisotropy of the third ferromagnetic layer 30 can be changed efficiently in the voltage application.

It is favorable for the fourth ferromagnetic layer 40 to include, for example, a metal material including at least one element selected from the group consisting of iron (Fe), cobalt (Co), nickel (Ni), manganese (Mn), and chrome (Cr). An alloy including the at least one element recited above and at least one element selected from the group consisting of platinum (Pt), palladium (Pd), iridium (Ir), ruthenium (Ru), and rhodium (Rh) also may be used.

For the fourth ferromagnetic layer 40, the characteristics such as, for example, the magnetization amount, the magnetic anisotropy, etc., can be adjusted by adjusting the compositions of the magnetic materials that are included, the conditions of the heat treatment, etc. The fourth ferromagnetic layer 40 may be, for example, a rare earth-transition metal amorphous alloy such as TbFeCo, GdFeCo, etc. The fourth ferromagnetic layer 40 may have a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the fourth ferromagnetic layer 40 may include Co/Ru, Fe/Au, Ni/Cu, etc.

In the example, the nonmagnetic tunneling barrier layer 31 is provided between the third ferromagnetic layer 30 and the fourth ferromagnetic layer 40; and the fourth ferromagnetic layer 40 also contacts the nonmagnetic tunneling barrier layer 31. However, the magnetic anisotropy of the fourth ferromagnetic layer 40 is larger than that of the third ferromagnetic layer 30. Therefore, the magnetization 14 of the fourth ferromagnetic layer 40 substantially does not change even when the first pulse voltage PV1 is applied. In other words, the direction of the magnetization 14 of the fourth ferromagnetic layer 40 substantially does not change.

The second nonmagnetic layer 20n may include, for example, a nonmagnetic metal layer.

The nonmagnetic metal layer included in the second nonmagnetic layer 20n may include, for example, at least one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os) or an alloy including at least two nonmagnetic metals selected from the group recited above. The nonmagnetic metal layer included in the second nonmagnetic layer 20n may be, for example, at least one selected from a conductive nitride, conductive oxide, or conductive fluoride including at least one element selected from the group recited above. For example, the second nonmagnetic layer 20n may include, for example, TiN, TaN, etc. The second nonmagnetic layer 20n may include a stacked film in which films of these materials are stacked. The second nonmagnetic layer 20n may include, for example, a stacked film of a Ti film/Ru film/Ti film, etc.

The second nonmagnetic layer 20n may include a material having a long spin diffusion length such as copper (Cu), etc., or a material having a short spin diffusion length such as ruthenium (Ru), etc. By the second nonmagnetic layer 20n including the material having the short spin diffusion length such as ruthenium (Ru), etc., the spin polarization of the electrons that flow can be quenched easily.

The first conductive layer 81 and the second conductive layer 82 may include, for example, a magnetic material that is conductive or a nonmagnetic material that is conductive. For example, substantially the same materials as the materials included in the third ferromagnetic layer 30 and the fourth ferromagnetic layer 40 may be used as the magnetic material that is conductive.

The nonmagnetic material that is conductive included in the first conductive layer 81 and the second conductive layer 82 may include, for example, one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy including at least two metals selected from the group recited above. The nonmagnetic material that is conductive included in the first conductive layer 81 and the second conductive layer 82 may be at least one selected from a conductive nitride, conductive oxide, or conductive fluoride including at least one element selected from the group recited above. The nonmagnetic material that is conductive included in the first conductive layer 81 and the second conductive layer 82 may be a carbon nanotube, a carbon nanowire, graphene, etc.

There are cases where a transistor is directly or indirectly connected to the first conductive layer 81 and/or the second conductive layer 82. In such a case, for example, the source portion and/or the drain portion of the transistor may be used as the first conductive layer 81 and/or the second conductive layer 82 recited above. Or, in such a case, for example, contact members connected to the source portion and/or the drain portion of the transistor may be used as the first conductive layer 81 and/or the second conductive layer 82 recited above.

The configuration of the first stacked unit SB1 and the configuration of the second stacked unit SB2 when projected onto the X-Y plane are arbitrary. The configuration of the first stacked unit SB1 and the configuration of the second stacked unit SB2 when projected onto the X-Y plane are, for example, a circle, an ellipse, a flattened circle, a polygon, etc. In the case of a polygon, it is favorable to have three or more corners such as a quadrilateral, a hexagon, etc. Also, the polygon may have rounded corners.

An example of a method for manufacturing the magnetic memory element 110 according to the first embodiment will now be described.

After forming a lower electrode (not shown) on the wafer, the wafer is disposed inside an ultra high vacuum sputtering apparatus. Then, a Ta/Ru layer (a contact layer for an electrode/stopper layer), an FePd/CoFeB layer (the second ferromagnetic layer 20), a MgO layer (the first nonmagnetic layer 10n), a CoFeB/FePt layer (the first ferromagnetic layer 10), and a Ru layer (a cap layer) are stacked in this order on the lower electrode. Here, it is also possible to adjust the strength of the magnetic anisotropy in the direction perpendicular to the film surface between the FePd/CoFeB layer and the CoFeB/FePt layer by annealing in a magnetic field.

Then, a resist mask having a diameter of 20 nm is formed by coating an EB resist and performing EB exposure. The portion not covered with the resist is cut away by ion milling until the Ta layer on the stopper layer/lower electrode is exposed.

Continuing, the wafer is disposed inside an ultra high vacuum sputtering apparatus; and a Ru layer (the second nonmagnetic layer 20n) is stacked.

A resist is coated onto the entire surface of the patterning body; and the resist is patterned by a stepper lithography apparatus such that the portion at the position of the second nonmagnetic layer 20n is covered with the resist. The portion not covered with the resist is cut away by ion milling. After filling a SiO$_2$ film for insulating, lift-off of the resist is performed.

Then, the wafer is disposed inside an ultra high vacuum sputtering apparatus; an FePt/CoFeB/Cu/Py layer (a magnetic field source) is stacked; and a Ta layer (a contact layer for the electrode) is stacked on the FePt/CoFeB/Cu/Py layer in this order.

Continuing, after filling a SiO$_2$ film for insulating and planarizing the magnetic memory element 110 by CMP, etc., the contact layer for the electrode is exposed by etching the entire surface by RIE (Reactive Ion Etching), etc.

A resist is coated onto the entire surface of the patterning body; and the resist is patterned by a stepper lithography apparatus such that the portion at the position of a via is not covered with the resist. The portion not covered with the resist is cut away by ion milling; and the resist is removed.

A resist is coated onto the entire surface of the patterning body; and the resist is patterned by a stepper lithography apparatus such that the portions at the positions of the via and the upper electrode are not covered with the resist. Cu is formed in a film to fill the openings corresponding to the via and the upper electrode; and the resist is removed. The electrical input/output to the upper electrode can be provided by providing a not-shown interconnect.

Thus, the magnetic memory element 110 is completed.

Figure 10:
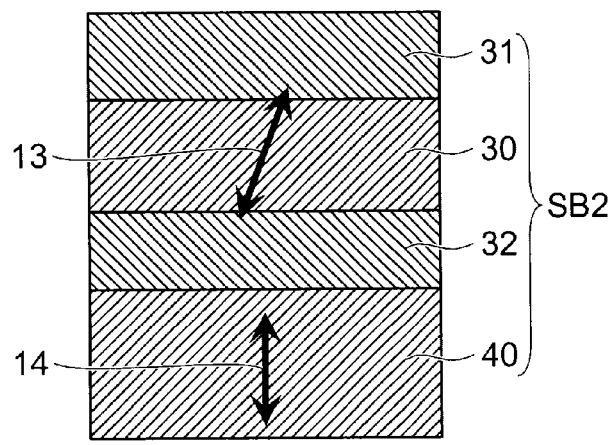
FIG. 10 is a schematic cross-sectional view showing another magnetic memory element according to the first embodiment.

FIG. 10 is a schematic cross-sectional view showing another magnetic memory element according to the first embodiment.

In the example as shown in FIG. 10, the second stacked unit SB2 further includes a nonmagnetic metal layer 32. The nonmagnetic metal layer 32 is provided between the third ferromagnetic layer 30 and the fourth ferromagnetic layer 40. For example, the fourth ferromagnetic layer 40, the nonmagnetic metal layer 32, the third ferromagnetic layer 30, and the nonmagnetic tunneling barrier layer 31 are stacked in this order.

In the example, the fourth ferromagnetic layer 40 functions as a magnetization rotation layer; and the third ferromagnetic layer 30 functions as a pinned layer having a changeable magnetization direction. In other words, in this example, the direction of the magnetization of the third ferromagnetic layer 30 is changeable; and the direction of the magnetization of the fourth ferromagnetic layer 40 also is changeable. For example, when the first pulse voltage PV1 having a rising time less than 1 ns is applied, the magnetic anisotropy of the third ferromagnetic layer 30 is modulated; and the magnetization 13 of the third ferromagnetic layer 30 is changed from the stacking direction SD1 to the in-plane direction SD2. Then, the magnetization 13 of the third ferromagnetic layer 30 processes with the in-plane direction SD2 as an axis. Thereby, it is possible to make upward and downward magnetization directions of the magnetization 13 of the third ferromagnetic layer 30 by the pulse voltage being switched OFF to match the period of the procession.

The change of the magnetic anisotropy when the first pulse voltage PV1 is applied occurs in the ferromagnetic layer contacting the nonmagnetic tunneling barrier layer 31 (the insulator). Therefore, the direction of the magnetization 14 of the fourth ferromagnetic layer 40 substantially does not change even in the case where the first pulse voltage PV1 is applied.

When the second pulse voltage PV2 is applied, for example, the magnetization 14 of the fourth ferromagnetic layer 40 processes with the stacking direction SD1 as an axis and a high frequency magnetic field is generated simultaneously by the spin-transfer torque based on the electrons passing through the third ferromagnetic layer 30. At this time, the direction of the magnetization 13 of the third ferromagnetic layer 30 does not change due to the action of the spin-transfer torque.

Thus, the third ferromagnetic layer 30 for which the magnetization direction changes according to the application of the first pulse voltage PV1 may be a pinned layer.

The nonmagnetic metal layer 32 may include, for example, one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two nonmagnetic metals selected from the group recited above. It is desirable for the thickness of the nonmagnetic metal layer 32 to be not less than 1.5 nm and not more than 20 nm. Thereby, interlayer coupling does not occur between the magnetic layers; and the loss of the spin-polarized state of the conduction electrons when passing through the nonmagnetic metal layer 32 is suppressed.

In the configuration of FIG. 10, the third ferromagnetic layer 30 may be a magnetization rotation layer; and the fourth ferromagnetic layer 40 may be a pinned layer.

Figure 11:
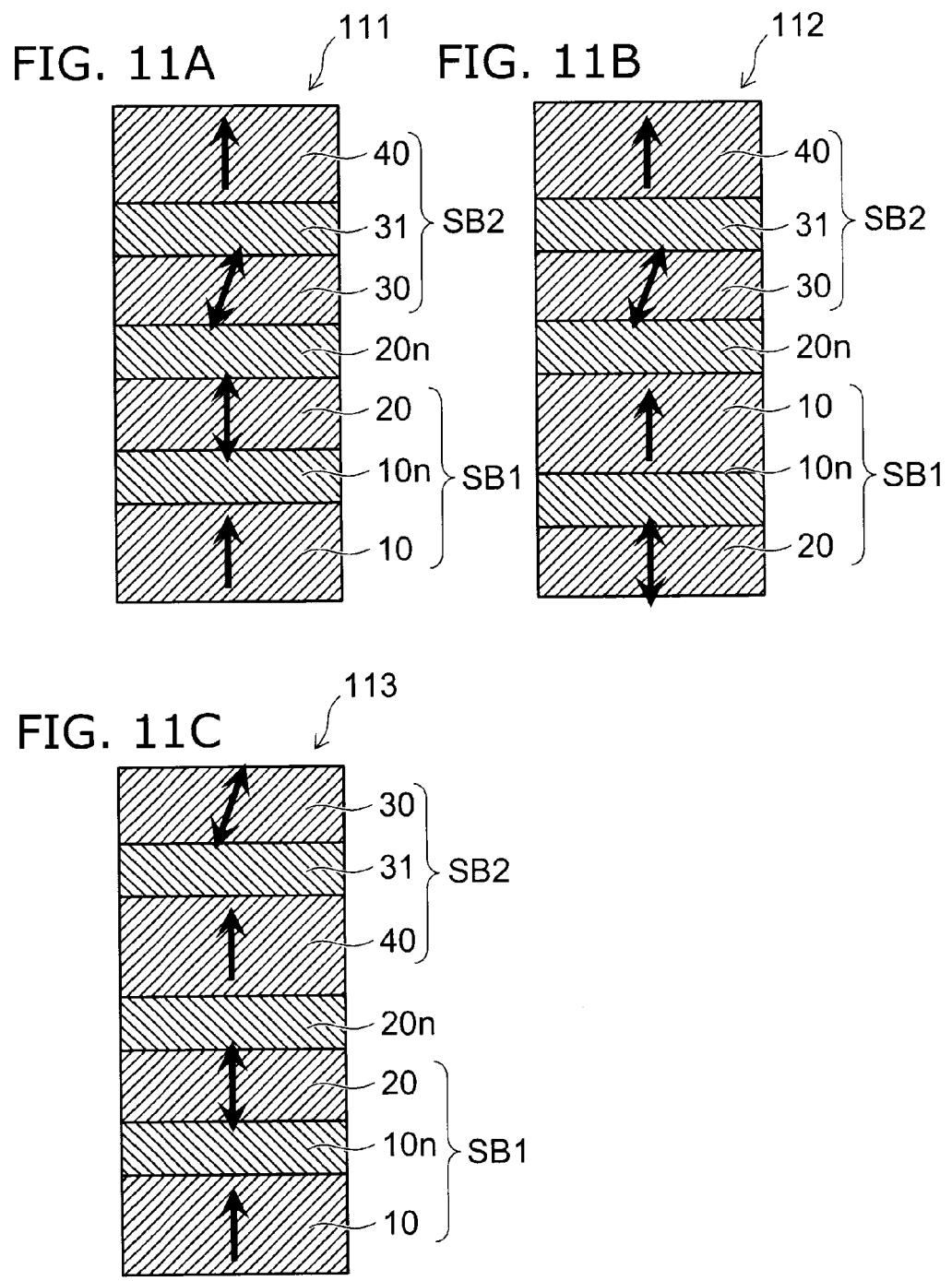
FIG. 11A to FIG. 11C are schematic cross-sectional views showing other magnetic memory elements according to the first embodiment.

FIG. 11A to FIG. 11C are schematic cross-sectional views showing other magnetic memory elements according to the first embodiment.

In a magnetic memory element 111 as shown in FIG. 11A, the first ferromagnetic layer 10, the first nonmagnetic layer 10n, the second ferromagnetic layer 20, the second nonmagnetic layer 20n, the third ferromagnetic layer 30, the nonmagnetic tunneling barrier layer 31, and the fourth ferromagnetic layer 40 are stacked in this order.

In a magnetic memory element 112 as shown in FIG. 11B, the second ferromagnetic layer 20, the first nonmagnetic layer 10n, the first ferromagnetic layer 10, the second nonmagnetic layer 20n, the third ferromagnetic layer 30, the nonmagnetic tunneling barrier layer 31, and the fourth ferromagnetic layer 40 are stacked in this order.

In a magnetic memory element 113 as shown in FIG. 11C, the first ferromagnetic layer 10, the first nonmagnetic layer 10n, the second ferromagnetic layer 20, the second nonmagnetic layer 20n, the fourth ferromagnetic layer 40, the nonmagnetic tunneling barrier layer 31, and the third ferromagnetic layer 30 are stacked in this order.

In the magnetic memory element 111 to the magnetic memory element 113, the second stacked unit SB2 may further include the nonmagnetic metal layer 32 (referring to FIG. 10). Thus, various modifications of the stacked configurations of the magnetic memory elements are possible.

FIG. 12A to FIG. 12D are schematic cross-sectional views showing other magnetic memory elements according to the first embodiment.

Figure 12:
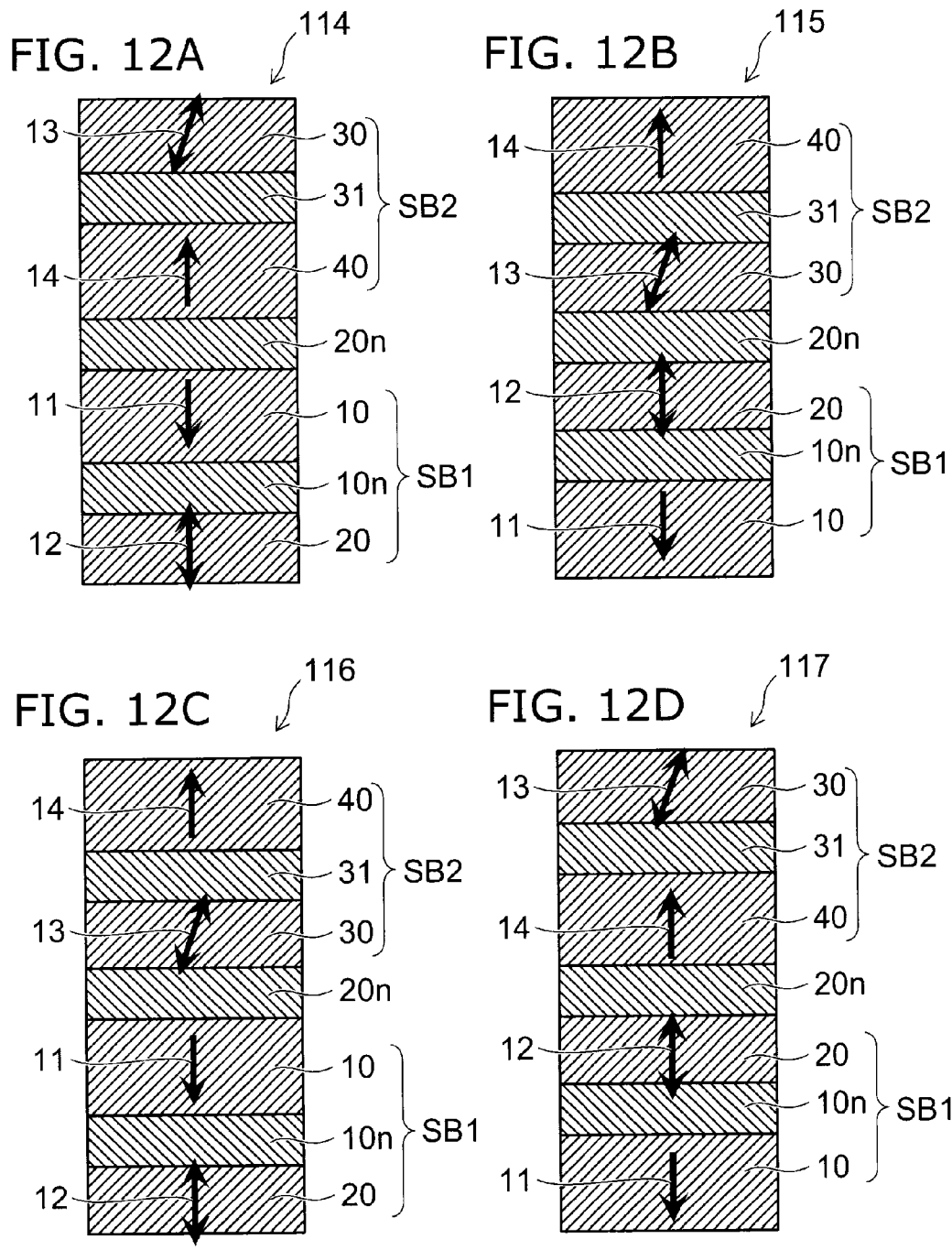
FIG. 12A to FIG. 12D are schematic cross-sectional views showing other magnetic memory elements according to the first embodiment.

In a magnetic memory element 114 as shown in FIG. 12A, the orientation of the component of the magnetization 11 of the first ferromagnetic layer 10 projected onto the stacking direction SD1 is the reverse of the orientation of the component of the magnetization 14 of the fourth ferromagnetic layer 40 projected onto the stacking direction SD1. In the example, the orientation of the magnetization 11 is downward; and the orientation of the magnetization 14 is upward. The orientation of the magnetization 11 may be upward; and the orientation of the magnetization 14 may be downward. The stacked configuration of the magnetic memory element 114 is substantially the same as the stacked configuration of the magnetic memory element 110.

In the magnetic memory element 114, the effect on the second ferromagnetic layer 20 of the leakage magnetic field from the first ferromagnetic layer 10, the third ferromagnetic layer 30, and the fourth ferromagnetic layer 40 can be suppressed by the orientation of the magnetization 11 being set to the reverse orientation with respect to the orientation of the magnetization 14. For example, the asymmetry of the magnetization reversal current due to the existence of the magnetic field can be suppressed. Thereby, in the nonvolatile memory device 610, misoperations can be suppressed more appropriately.

In a magnetic memory element 115 to a magnetic memory element 117 as shown in FIG. 12B to FIG. 12D, similarly to the magnetic memory element 114, the orientation of the component of the magnetization 11 of the first ferromagnetic layer 10 projected onto the stacking direction SD1 is the reverse of the orientation of the component of the magnetization 14 of the fourth ferromagnetic layer 40 projected onto the stacking direction SD1.

The stacked configuration of the magnetic memory element 115 is substantially the same as the stacked configuration of the magnetic memory element 111. The stacked configuration of the magnetic memory element 116 is substantially the same as the stacked configuration of the magnetic memory element 112. The stacked configuration of the magnetic memory element 117 is substantially the same as the stacked configuration of the magnetic memory element 113. In the magnetic memory element 114 to the magnetic memory element 117, the second stacked unit SB2 may further include the nonmagnetic metal layer 32 (referring to FIG. 10). Thus, various modifications of the stacked configurations of the magnetic memory elements are possible even in the case where the orientation of the magnetization 11 is set to be the reverse of the orientation of the magnetization 14.

In the configuration of the magnetic memory element 111 shown in FIG. 11A and the configuration of the magnetic memory element 115 shown in FIG. 12B, in the case where the electrons passing through the second nonmagnetic layer 20n maintain their spin information, the third ferromagnetic layer 30 is affected by the spin-transfer torque from the second ferromagnetic layer 20. Therefore, there are cases where the controllability of the magnetization rotation of the third ferromagnetic layer 30 decreases. In such a case, it is desirable for, for example, a film having a short spin diffusion length (a material having a spin-quenching function) such as ruthenium (Ru), etc., or a layer having a structure having a short spin diffusion length to be used as the second nonmagnetic layer 20n. Thereby, the decrease of the controllability of the magnetization rotation of the third ferromagnetic layer 30 can be suppressed.

As recited above, in the case where the material of the second nonmagnetic layer 20n is selected, the magnitude of the spin-transfer torque to cause the magnetization 13 of the third ferromagnetic layer 30 to process is determined by the spin polarization at the fourth ferromagnetic layer 40. In this configuration, it is possible to independently control the magnetization 13 of the third ferromagnetic layer 30 without being affected by the spins (the spin-transfer torque) of other electrons.

The second nonmagnetic layer 20n may include a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two metals selected from the group as the material to obtain the spin-quenching effect.

It is desirable for the thickness of the second nonmagnetic layer 20n to be set to be a value such that the second ferromagnetic layer 20 and the third ferromagnetic layer 30 do not have interlayer magnetic coupling. Specifically, it is desirable for the thickness of the second nonmagnetic layer 20n to be set to be not less than 1.4 nm.

In the case where the thickness of the second nonmagnetic layer 20n is set to be not less than 1.4 nm, the interlayer coupling between the second ferromagnetic layer 20 and the third ferromagnetic layer 30 can be suppressed. The spin polarization of the conduction electrons that pass through the interior and interface of the second nonmagnetic layer 20n can be quenched by the second nonmagnetic layer 20n. Further, the second nonmagnetic layer 20n can suppress the change of the procession of the third ferromagnetic layer 30 due to the orientation of the magnetization 12 of the second ferromagnetic layer 20.

On the other hand, in the case where the thickness of the second nonmagnetic layer 20n exceeds 20 nm, for example, a pillar configuration of the multilayered film becomes difficult. Moreover, the strength of the high frequency magnetic field (the rotating magnetic field) generated by the third ferromagnetic layer 30 attenuates at the position of the second ferromagnetic layer 20. Therefore, it is desirable for the thickness of the second nonmagnetic layer 20n to be set to be not more than 20 nm.

Other than the single-layer film described above, a stacked film may be used as the second nonmagnetic layer 20n. The stacked film may have, for example, a stacked configuration of a copper (Cu) layer stacked on at least one side of a layer including a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two metals selected from the group.

The stacked film included in the second nonmagnetic layer 20n may have a stacked configuration including a first layer and a second layer stacked on at least one side of the first layer. The first layer includes, for example, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two metals selected from the group. The second layer includes an oxide including at least one element selected from the group consisting of aluminum (Al), magnesium (Mg), titanium (Ti), iron (Fe), cobalt (Co), nickel (Ni), vanadium (V), chrome (Cr), tantalum (Ta), tungsten (W), and ruthenium (Ru).

Figure 13:
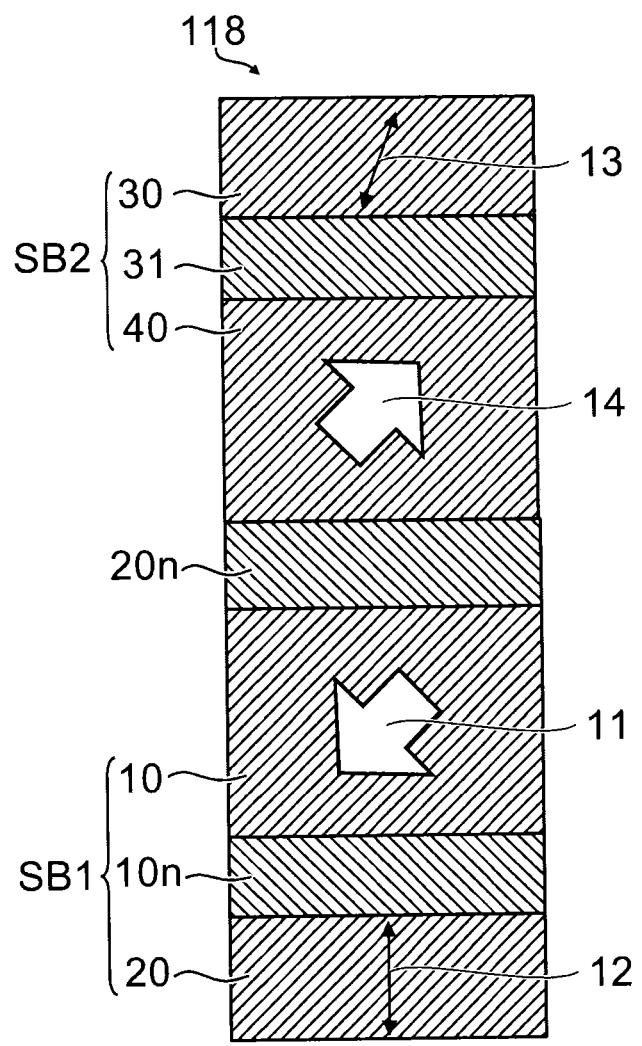
FIG. 13 is a schematic cross-sectional view showing another magnetic memory element according to the first embodiment.

FIG. 13 is a schematic cross-sectional view showing another magnetic memory element according to the first embodiment.

In the magnetic memory element 118 as shown in FIG. 13, the second nonmagnetic layer 20n is provided between the first stacked unit SB1 and the second stacked unit SB2. The second nonmagnetic layer 20n is provided, for example, between the first ferromagnetic layer 10 and the fourth ferromagnetic layer 40. In the example, the second nonmagnetic layer 20n contacts the first ferromagnetic layer 10 and the fourth ferromagnetic layer 40. The direction of the magnetization 11 of the first ferromagnetic layer 10 and the direction of the magnetization 14 of the fourth ferromagnetic layer 40 are oblique to the stacking direction SD1.

In the magnetic memory element 118, the orientation of the component of the magnetization 11 projected onto the stacking direction SD1 is the reverse orientation with respect to the orientation of the component of the magnetization 14 projected onto the stacking direction SD1. In such a case, the leakage magnetic field in the direction perpendicular to the film surface at the position of the second ferromagnetic layer 20 can be reduced. In other words, the leakage magnetic field in the direction perpendicular to the film surface at the position of the second ferromagnetic layer 20 can be canceled. On the other hand, the leakage magnetic field in the direction perpendicular to the film surface at the position of the third ferromagnetic layer 30 remains to have an action.

In the magnetic memory element 118, the first ferromagnetic layer 10 and the fourth ferromagnetic layer 40 may have antiferromagnetical coupling via the second nonmagnetic layer 20n. Such a structure in which the directions of the magnetizations have antiferromagnetical coupling with each other via a nonmagnetic layer and are antiparallel is called a synthetic anti-ferromagnetic (SAF) structure. In this example, the stacked structure of a first magnetic layer (e.g., the first ferromagnetic layer 10)/nonmagnetic layer (e.g., the second nonmagnetic layer 20n)/second magnetic layer (e.g., the fourth ferromagnetic layer 40) corresponds to a SAF structure.

By using a SAF structure, the mutual magnetization fixing power is increased; and the resistance to external magnetic fields and the thermal stability can be improved. In this structure, the leakage magnetic field in the direction perpendicular to the film surface at the position of the magnetic storage layer (e.g., the second ferromagnetic layer 20) can be substantially zero.

The nonmagnetic layer (the intermediate layer) of the SAF structure may include a metal material such as ruthenium (Ru), iridium (Ir), osmium (Os), etc. The thickness of the nonmagnetic layer is set to be, for example, not more than 3 nm. Thereby, a sufficiently strong antiferromagnetical coupling is obtained via the nonmagnetic layer.

In other words, the second nonmagnetic layer 20n includes, for example, one metal selected from the group consisting of ruthenium (Ru), osmium (Os), and iridium (Ir) or an alloy including at least two metals selected from the group. The thickness of the second nonmagnetic layer 20n is, for example, not more than 3 nm.

In the magnetic memory element 118, the second stacked unit SB2 may further include the nonmagnetic metal layer 32 (referring to FIG. 10). Various modifications of the stacked configurations of the magnetic memory elements are possible even in the case where the direction of the magnetization 11 and the direction of the magnetization 14 are set to be oblique to the stacking direction SD1. In the configuration in which the orientation of the component of the magnetization 11 projected onto the stacking direction SD1 is the same as the orientation of the component of the magnetization 14 projected onto the stacking direction SD1, the direction of the magnetization 11 and the direction of the magnetization 14 may be set to be oblique to the stacking direction SD1.

The dimensions (the width, the thickness, etc.) of the layers included in the magnetic memory elements 110 to 118 according to the embodiment are determined by, for example, electron microscope photographs, etc. In the magnetic memory elements 110 to 118 recited above, the size of the first stacked unit SB1 when projected onto the X-Y plane (e.g., the width in the X-axis direction or the width in the Y-axis direction) may be the same as, smaller than, or larger than the size of the second stacked unit SB2 when projected onto the X-Y plane.

Figure 14A:
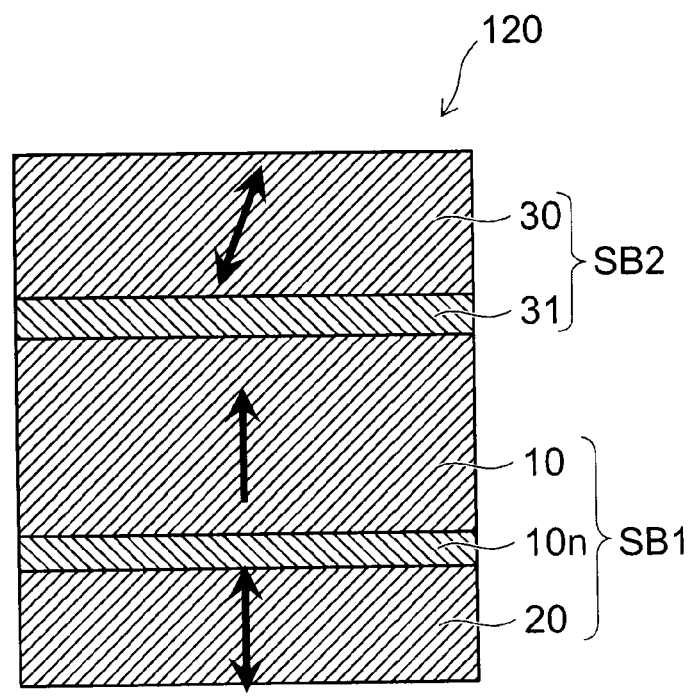
FIG. 14A and FIG. 14B are schematic cross-sectional views showing other magnetic memory elements according to the first embodiment.
Figure 14B:
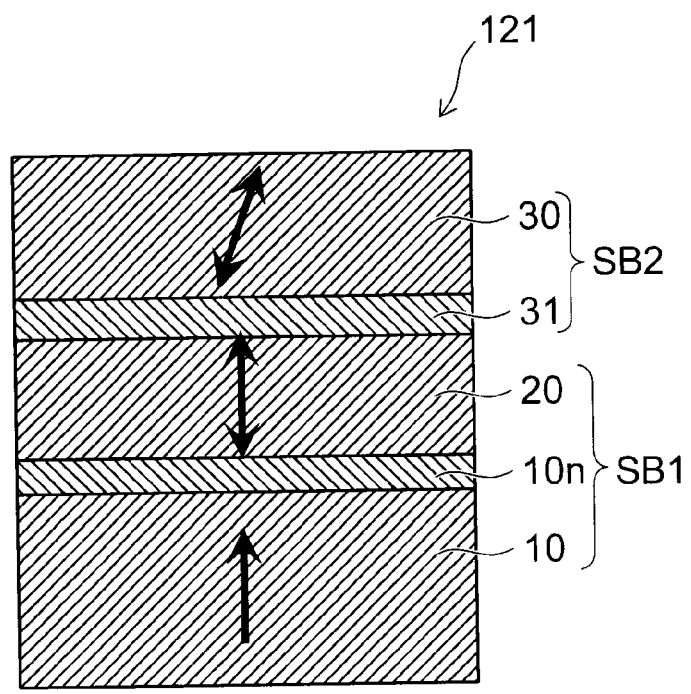

FIG. 14A and FIG. 14B are schematic cross-sectional views showing other magnetic memory elements according to the first embodiment.

As shown in FIG. 14A and FIG. 14B, the fourth ferromagnetic layer 40 is omitted from a magnetic memory element 120 and a magnetic memory element 121. In the magnetic memory element 120 and the magnetic memory element 121, the nonmagnetic tunneling barrier layer 31 is provided between the first stacked unit SB1 and the third ferromagnetic layer 30. In the magnetic memory element 120, the second ferromagnetic layer 20, the first nonmagnetic layer 10n, the first ferromagnetic layer 10, the nonmagnetic tunneling barrier layer 31, and the third ferromagnetic layer 30 are stacked in this order. In the magnetic memory element 121, the first ferromagnetic layer 10, the first nonmagnetic layer 10n, the second ferromagnetic layer 20, the nonmagnetic tunneling barrier layer 31, and the third ferromagnetic layer 30 are stacked in this order.

In the configuration of the magnetic memory element 120 and the configuration of the magnetic memory element 121, the first ferromagnetic layer 10 is used as both the pinned layer of the MTJ and the pinned layer of the STO. In the configuration of the magnetic memory element 120 and the configuration of the magnetic memory element 121 as well, for example, the programming of the second ferromagnetic layer 20 can be assisted by implementing the first setting operation after implementing the first preliminary operation. In the nonvolatile memory device 610, misoperations can be suppressed. Thus, the fourth ferromagnetic layer 40 may be provided in the magnetic memory element if necessary and is omissible.

Figure 15:
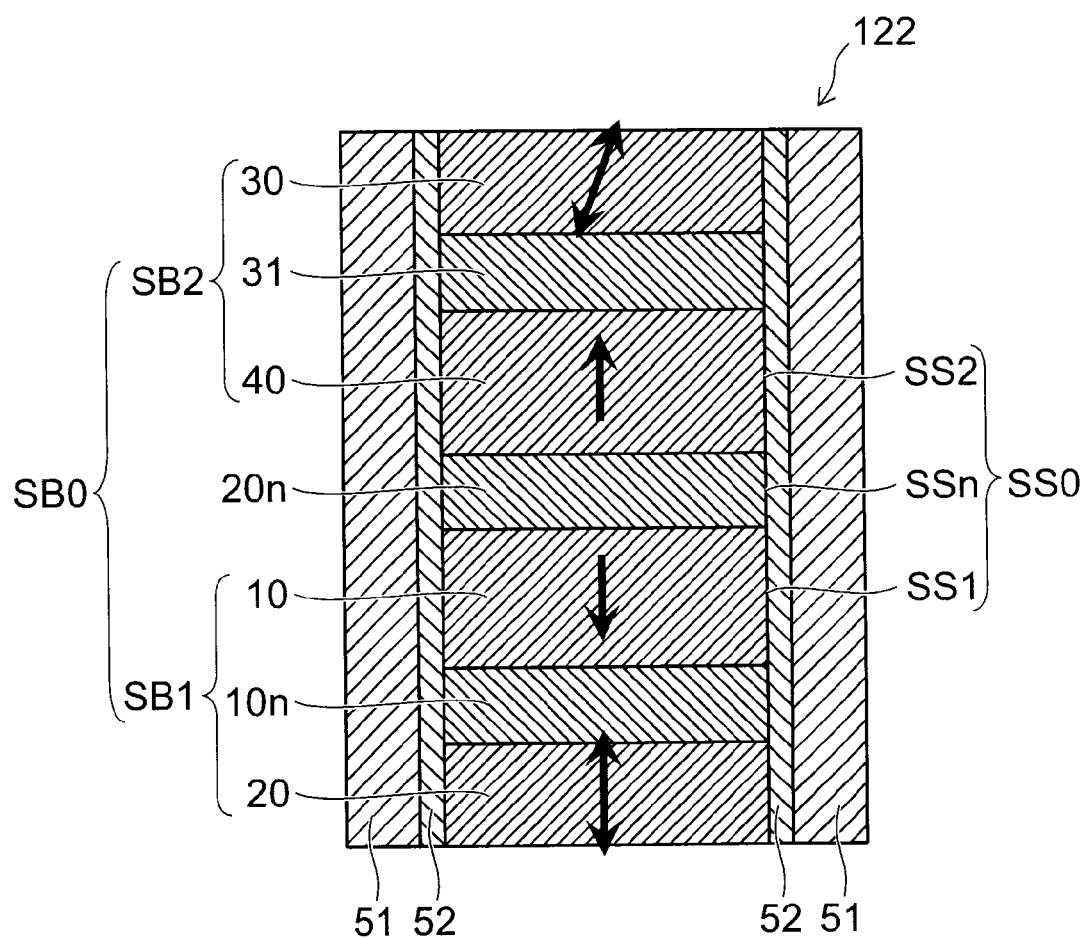
FIG. 15 is a schematic cross-sectional view showing another magnetic memory element according to the first embodiment.

FIG. 15 is a schematic cross-sectional view showing another magnetic memory element according to the first embodiment.

As shown in FIG. 15, the magnetic memory element 122 further includes a magnetic shield 51. The magnetic shield 51 covers at least a portion of a side surface SS0 of the stacked body SB0. In other words, the magnetic shield 51 opposes at least a portion of the side surface SS0 of the stacked body SB0. The side surface SS0 of the stacked body SB0 includes, for example, a side surface SS1 of the first stacked unit SB1, a side surface SS2 of the second stacked unit SB2, and a side surface SSn of the second nonmagnetic layer 20n. In the example, the magnetic shield 51 covers the side surface SS1, the side surface SS2, and the side surface SSn. The configuration of the magnetic shield 51 projected onto the X-Y plane has, for example, an annular configuration around the stacked body SB0.

The magnetic memory element 122 further includes a protective layer 52 provided between the magnetic shield 51 and the side surface SS0 of the stacked body SB0. It is desirable for the thickness of the protective layer 52 to be substantially the same as or greater than the distance in the Z-axis direction from the Z-axis direction center of the second ferromagnetic layer 20 to the Z-axis direction center of the third ferromagnetic layer 30. The distance in the Z-axis direction between the Z-axis direction center of the second ferromagnetic layer 20 and the Z-axis direction center of the third ferromagnetic layer 30 is, for example, shortest at the configuration of the magnetic memory element 111 and the configuration of the magnetic memory element 115 and longest at the configuration of the magnetic memory element 110 and the configuration of the magnetic memory element 114. It is desirable for the thickness of the protective layer 52 to be, for example, not less than 2 nm and not more than 30 nm.

For example, the side surface SS1 of the first stacked unit SB1 and the side surface SS2 of the second stacked unit SB2 are covered with the magnetic shield 51 of permalloy (Py), etc., with the protective layer 52 of SiN, $Al_2O_3$, etc., interposed. Thereby, for example, negative effects of the leakage magnetic field from an adjacent magnetic memory element 122 on the operations of the first stacked unit SB1 and the second stacked unit SB2 are suppressed in the case where multiple magnetic memory elements 122 are arranged. For example, the fluctuation of the reversal current between bits is suppressed because the effective magnetic field acting on the first stacked unit SB1 is substantially the same between the memory cells (the stacked bodies SB0). Similarly, the fluctuation of the generation current of the second stacked unit SB2 is suppressed. The actions of the second stacked unit SB2 and the leakage magnetic field from the first stacked unit SB1 on the adjacent magnetic memory element can be suppressed. As a result, the multiple magnetic memory elements can be disposed proximally to each other to increase the bit density. For example, the bit density of the nonvolatile memory device can be increased.

The magnetic shield 51 may include one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), vanadium (V), zirconium (Zn), magnesium (Mg), silicon (Si), and aluminum (Al) or an alloy including at least two metals selected from the group recited above.

The magnetic shield 51 may be, for example, one metal selected from the group consisting of iron (Fe), cobalt (Co), nickel (Ni), manganese (Mn), and chrome (Cr) or an alloy including at least two metals selected from the group. The magnetic shield 51 may be, for example, an alloy including at least one metal selected from the group consisting of iron (Fe), cobalt (Co), nickel (Ni), manganese (Mn), and chrome (Cr) and at least one metal selected from the group consisting of platinum (Pt), palladium (Pd), iridium (Ir), ruthenium (Ru), and rhodium (Rh).

The characteristics of the magnetic shield 51 can be adjusted by adjusting the composition of the magnetic material included in the magnetic shield 51 and/or the conditions of the heat treatment. The magnetic shield 51 may be, for example, a rare earth-transition metal amorphous alloy of TbFeCo, GdFeCo, etc. The magnetic shield 51 may include a stacked structure of Co/Pt, Co/Pd, Co/Ni, etc.

The protective layer 52 may include, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). The protective layer 52 may include, for example, SiN.

Figure 16:
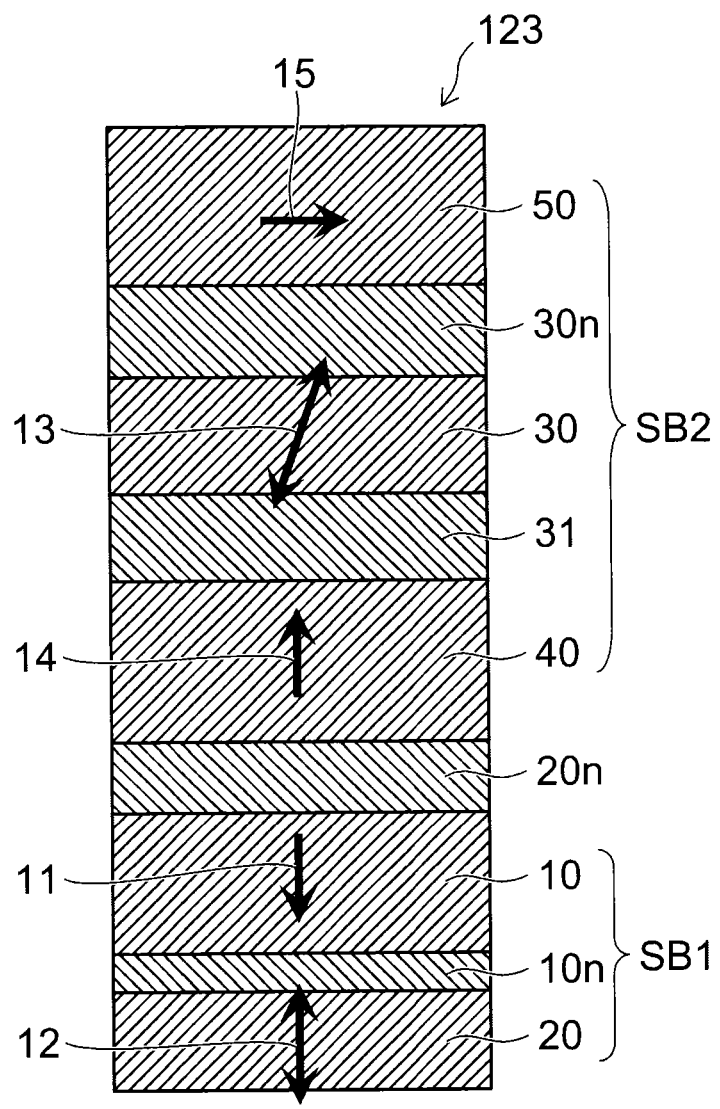
FIG. 16 is a schematic cross-sectional view showing another magnetic memory element according to the first embodiment.

FIG. 16 is a schematic cross-sectional view showing another magnetic memory element according to the first embodiment.

In the magnetic memory element 123 as shown in FIG. 16, the second stacked unit SB2 further includes a fifth ferromagnetic layer 50 and a third nonmagnetic layer 30n. The fifth ferromagnetic layer 50 is stacked with the third ferromagnetic layer 30 in the stacking direction SD1. The third nonmagnetic layer 30n is provided between the third ferromagnetic layer 30 and the fifth ferromagnetic layer 50. In the second stacked unit SB2 of the example, the fourth ferromagnetic layer 40, the nonmagnetic tunneling barrier layer 31, the third ferromagnetic layer 30, the third nonmagnetic layer 30n, and the fifth ferromagnetic layer 50 are stacked in this order. The stacked configuration of the second stacked unit SB2 of the magnetic memory element 123 is not limited thereto; and various modifications are possible.

A magnetization 15 of the fifth ferromagnetic layer 50 is oriented, for example, in the in-plane direction SD2. The component of the magnetization 15 projected onto the in-plane direction SD2 is larger than the component of the magnetization projected onto the stacking direction SD1. The fifth ferromagnetic layer 50 is, for example, an in-plane magnetization film.

In the magnetic memory element 123, for example, the magnetization 13 of the third ferromagnetic layer 30 tilts with respect to the stacking direction SD1 due to the leakage magnetic field from the fifth ferromagnetic layer 50. For example, a component (the in-plane magnetization component 72b) of the magnetization 13 that is oriented in the in-plane direction SD2 occurs. Thereby, in the magnetic memory element 123, for example, the magnetic anisotropy of the third ferromagnetic layer 30 can be changed more efficiently by the application of the first pulse voltage PV1. The controllability of the magnetization reversal of the third ferromagnetic layer 30 can be improved.

The material of the fifth ferromagnetic layer 50 is, for example, substantially the same as the material of the first ferromagnetic layer 10 and the material of the fourth ferromagnetic layer 40. The material of the third nonmagnetic layer 30n is, for example, substantially the same as the material of the first nonmagnetic layer 10n and the material of the second nonmagnetic layer 20n.

Figure 17A:
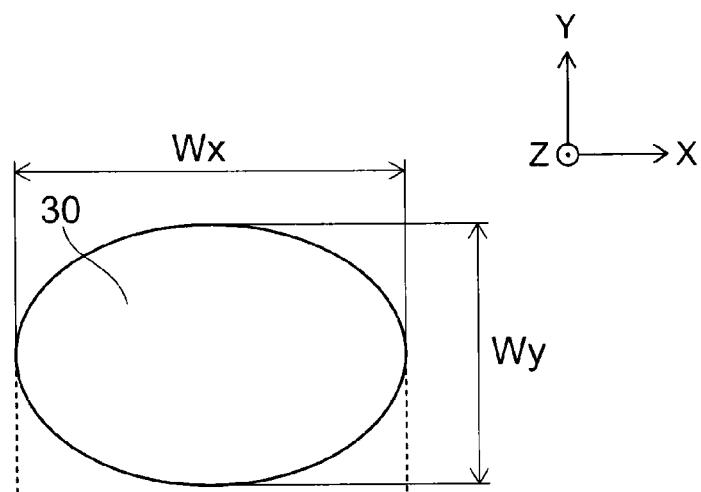
FIG. 17A and FIG. 17B are schematic views showing another magnetic memory element according to the first embodiment.
Figure 17B:
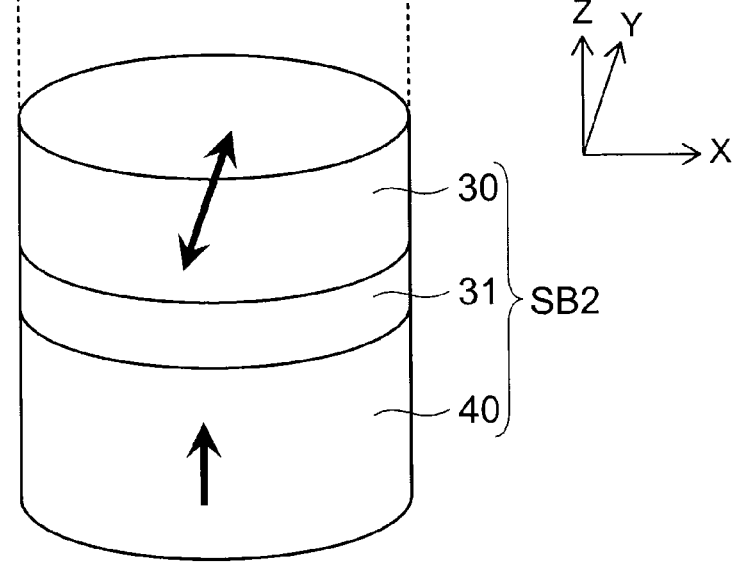

FIG. 17A and FIG. 17B are schematic views showing another magnetic memory element according to the first embodiment.

FIG. 17A is a schematic plan view showing another second stacked unit SB2 according to the first embodiment; and FIG. 17B is a schematic perspective view.

In the second stacked unit SB2 of the example as shown in FIG. 17A and FIG. 17B, the ratio of a width Wx of the third ferromagnetic layer 30 in the X-axis direction and a width Wy of the third ferromagnetic layer 30 in the Y-axis direction is Wx/Wy>1. In other words, the width Wx is wider than the width Wy.

In the example, the configuration of the third ferromagnetic layer 30 projected onto the X-Y plane is an ellipse. In such a case, the width Wx is the major diameter of the third ferromagnetic layer 30; and the width Wy is the minor diameter of the third ferromagnetic layer 30. The configuration of the third ferromagnetic layer 30 projected onto the X-Y plane may be, for example, a polygon. The configuration of the first ferromagnetic layer 10, the configuration of the first nonmagnetic layer 10n, the configuration of the second ferromagnetic layer 20, the configuration of the nonmagnetic tunneling barrier layer 31, and the configuration of the fourth ferromagnetic layer 40 may be substantially the same as or different from the configuration of the third ferromagnetic layer 30 when projected onto the X-Y plane.

FIRST EXAMPLE

FIG. 18A to FIG. 18E are schematic views showing an example of the nonvolatile memory device according to the first embodiment.

FIG. 18A is a graph showing the application of the pulse voltages.

FIG. 18B is a graph showing the normalized value Mz.

FIG. 18C to FIG. 18E are schematic cross-sectional views showing the states of the magnetizations of each layer of the magnetic memory element 114.

In FIG. 18A and FIG. 18B, the horizontal axis is the time TM. The vertical axis of FIG. 18A is the value of the pulse voltage that is applied. The vertical axis of FIG. 18B is the normalized value Mz.

In the third ferromagnetic layer 30, for example, there are cases where the magnetization 13 is tilted with respect to the stacking direction SD1 (referring to FIGS. 5A to 5C) and the Δ value is small. The Δ value is, for example, the ratio of the magnetic anisotropy energy and the thermal energy of the third ferromagnetic layer 30. The magnetization 13 is stabilized as the Δ value increases. Therefore, the control unit 550 applies a pulse voltage PVr to the magnetic memory element 114 to read (determine) the direction of the magnetization 13 prior to the application of the first pulse voltage PV1 to clarify the direction of the magnetization 13 of the third ferromagnetic layer 30 in the start state.

The absolute value of the pulse voltage PVr for reading is less than the absolute value of the first pulse voltage PV1 and the absolute value of the second pulse voltage PV2. For example, the absolute value of the current supplied to the magnetic memory element 114 by the application of the pulse voltage PVr is less than the absolute value of the current supplied to the magnetic memory element 114 by the application of the first pulse voltage PV1 and the absolute value of the current supplied to the magnetic memory element 114 by the application of the second pulse voltage PV2.

The reading of the direction of the magnetization 13 is implemented by, for example, utilizing the magnetoresistance effect similarly to the case of reading the magnetization 12 of the second ferromagnetic layer 20. For example, the magnetoresistance effect of the magnetic memory element 114 has a total of four values, i.e., the two values of upward and downward of the magnetization 12 of the second ferromagnetic layer 20 and the two values of upward and downward of the magnetization 13 of the third ferromagnetic layer 30. The control unit 550 determines the directions of the magnetization 12 and the magnetization 13 by, for example, the resistance value of the magnetic memory element 114 when the pulse voltage PVr is applied.

FIG. 18B and FIG. 18C show the case where the control unit 550 determines that the direction of the magnetization 13 is downward as a result of performing the reading by applying the pulse voltage PVr. In the case where the control unit 550 determines that the direction of the magnetization 13 is different from the target direction of the magnetization 13, the control unit 550 applies the first pulse voltage PV1. In this example, in the case where the direction of the magnetization 13 is upward, the control unit 550 applies the first pulse voltage PV1 for which the first rising time tr1<$\tau_{relax}$ to the magnetic memory element 114. Subsequently, the magnetization 13 of the third ferromagnetic layer 30 is caused to oscillate (process) and a high frequency magnetic field is generated by the spin-transfer torque by applying the second pulse voltage PV2 to the magnetic memory element 114. In the case where the control unit 550 determines that the direction of the magnetization 13 is the same as the target direction of the magnetization 13, the application of the second pulse voltage PV2 is implemented without implementing the application of the first pulse voltage PV1. As a result, the magnetization reversal of the second ferromagnetic layer 20 is assisted by the high frequency magnetic field; and the magnetization reversal of the second ferromagnetic layer 20 is possible at a low current.

SECOND EXAMPLE

FIG. 19A to FIG. 19D are schematic views showing another example of the nonvolatile memory device according to the first embodiment.

FIG. 19A and FIG. 19C are schematic cross-sectional views showing the states of the magnetizations of each layer of the magnetic memory element 114.

FIG. 19B and FIG. 19D are graphs showing the application of the pulse voltages.

In FIG. 19B and FIG. 19D, the horizontal axis is the time TM; and the vertical axis is the value of the pulse voltage that is applied.

First, the programming of the magnetization of the first stacked unit SB1 (the MTJ) from the antiparallel state to the parallel state will be described. It is desirable for the orientation of the procession of the second ferromagnetic layer 20 to match the orientation of the rotating magnetic field generated when the magnetization 13 of the third ferromagnetic layer 30 oscillates to efficiently assist the magnetization reversal of the second ferromagnetic layer 20. The orientation of the procession of the third ferromagnetic layer 30 is determined from, for example, the LLG equation of Formula (2).

[Formula 2]

$$\frac{d\vec{M}}{dt} = -\gamma \cdot \vec{M} \times \vec{H}_{eff} - \alpha \vec{M} \times \frac{d\vec{M}}{dt} - g \cdot \frac{I}{e} \cdot \frac{\hbar}{2} \{\vec{M} \times (\vec{M} \times \vec{p})\} \quad (2)$$

$$\hbar = \frac{h}{2\pi}$$

The total spin angular momentum M (N·m·s (newton·meter·seconds)) of the third ferromagnetic layer 30, the gyromagnetic constant γ (γ<0) (Hz/Oe), the Gilbert damping constant α, the effective magnetic field $H_{eff}$ (Oe) applied to the third ferromagnetic layer 30, the function g of the spin transfer efficiency, the current I (A), the electron charge e (C), the unit magnetization p (emu/cm$^3$) of the fourth ferromagnetic layer 40, and Planck's constant h (J·s) are used in Formula (2). As illustrated by the arrows in Formula (2), the angular momentum M, the effective magnetic field $H_{eff}$, and the unit magnetization p are vectors.

The first term of the right side of Formula (2) is the procession; the second term is the damping; and the third term is the spin torque. For the conditions at which the third ferromagnetic layer 30 oscillates, the second term and the third term of the right side cancel; and only the first term remains. Thereby, the rotation direction of the magnetization 13 of the third ferromagnetic layer 30 is the orientation of $M \times H_{eff}$.

To determine the rotation direction of the magnetization 13 of the third ferromagnetic layer 30, first, the magnetization direction of the third ferromagnetic layer 30 is read by applying the pulse voltage PVr. In the case where the magnetization 12 of the second ferromagnetic layer 20 is upward in the configuration of the magnetic memory element 114 as shown in FIG. 19A, the orientation of the magnetization 13 of the third ferromagnetic layer 30 is set to be upward. Thereby, the orientation of the rotating magnetic field generated when the magnetization 13 of the third ferromagnetic layer 30 oscillates matches the orientation of the procession of the second ferromagnetic layer 20. In the case where the direction of the magnetization 13 of the third ferromagnetic layer 30 is downward, the direction of the magnetization 13 is caused to reverse upward by applying the first pulse voltage PV1. Subsequently, the magnetization 13 of the third ferromagnetic layer 30 is caused to oscillate by the spin-transfer torque by applying the second pulse voltage PV2.

The programming of the magnetization of the first stacked unit SB1 from the parallel state to the antiparallel state will now be described. To determine the rotation direction of the magnetization 13 of the third ferromagnetic layer 30, first, the magnetization direction of the third ferromagnetic layer 30 is read by applying the pulse voltage PVr. In the case where the magnetization 12 of the second ferromagnetic layer 20 is downward in the configuration of the magnetic memory element 114 as shown in FIG. 19C, the orientation of the magnetization 13 of the third ferromagnetic layer 30 is set to be downward. Thereby, the orientation of the rotating magnetic field generated when the magnetization 13 of the third ferromagnetic layer 30 oscillates matches the orientation of the procession of the second ferromagnetic layer 20. In the case where the direction of the magnetization 13 of the third ferromagnetic layer 30 is upward, the direction of the magnetization 13 is caused to reverse downward by applying the third pulse voltage PV3. Subsequently, the magnetization 13 of the third ferromagnetic layer 30 is caused to oscillate by the spin-transfer torque by applying the fourth pulse voltage PV4.

Thus, according to the embodiment, it is possible to efficiently perform the magnetization reversal with bidirectional current.

THIRD EXAMPLE

FIG. 20A to FIG. 20D are schematic views showing another example of the nonvolatile memory device according to the first embodiment.

Figure 20A:
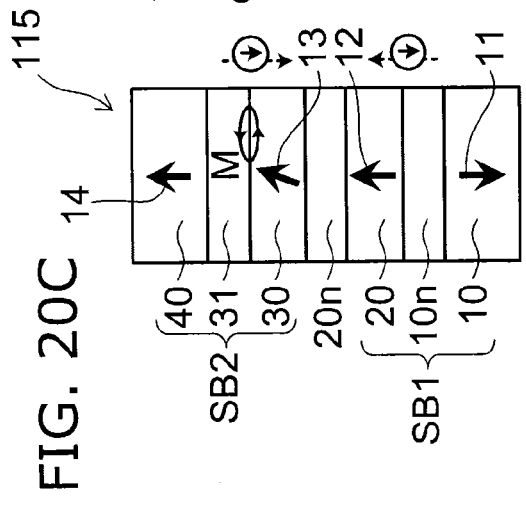
FIG. 20A to FIG. 20D are schematic views showing another example of the nonvolatile memory device according to the first embodiment.
Figure 20C:
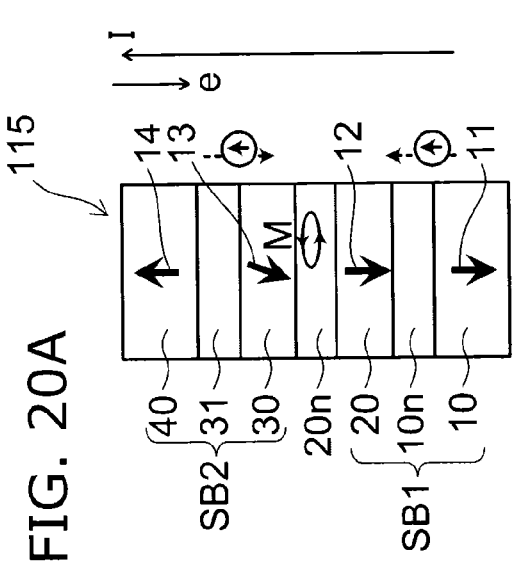

FIG. 20A and FIG. 20C are schematic cross-sectional views showing the states of the magnetizations of each layer of the magnetic memory element 115.

Figure 20B:
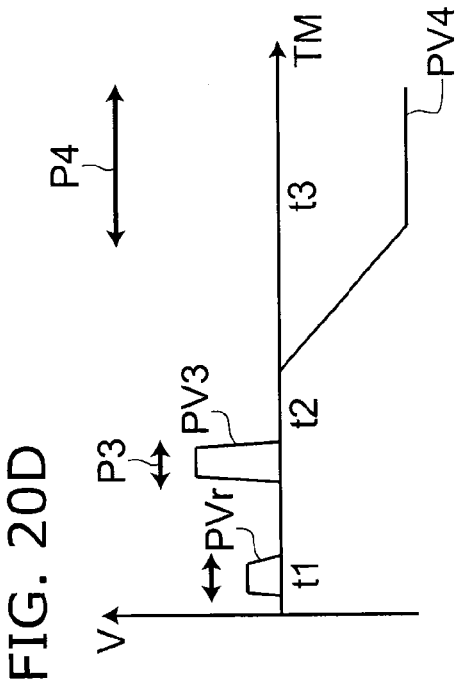
Figure 20D:
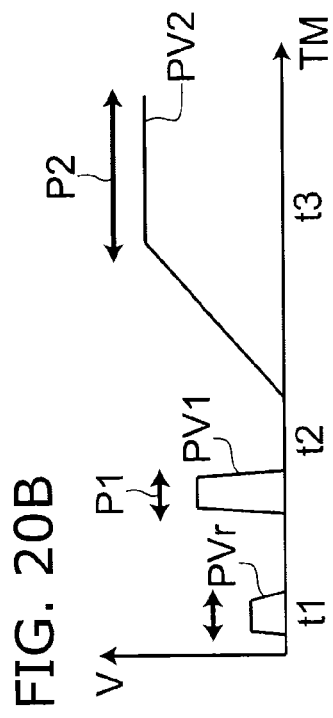

FIG. 20B and FIG. 20D are graphs showing the application of the pulse voltages.

In FIG. 20B and FIG. 20D, the horizontal axis is the time TM; and the vertical axis is the value of the pulse voltage that is applied.

First, the programming of the magnetization of the first stacked unit SB1 from the antiparallel state to the parallel state will be described. To determine the rotation direction of the magnetization 13 of the third ferromagnetic layer 30, first, the magnetization direction of the third ferromagnetic layer 30 is read by applying the pulse voltage PVr. In the configuration of the magnetic memory element 115 as shown in FIG. 20A, in the case where the magnetization 12 of the second ferromagnetic layer 20 is downward, the orientation of the magnetization 13 of the third ferromagnetic layer 30 is set to be downward. Thereby, the orientation of the rotating magnetic field generated when the magnetization 13 of the third ferromagnetic layer 30 oscillates matches the orientation of the procession of the second ferromagnetic layer 20. In the case where the direction of the magnetization 13 of the third ferromagnetic layer 30 is upward, the direction of the magnetization 13 is caused to reverse downward by applying the first pulse voltage PV1. Subsequently, the magnetization 13 of the third ferromagnetic layer 30 is caused to oscillate by the spin-transfer torque by applying the second pulse voltage PV2.

The programming of the magnetization of the first stacked unit SB1 from the parallel state to the antiparallel state will now be described. To determine the rotation direction of the magnetization 13 of the third ferromagnetic layer 30, first, the magnetization direction of the third ferromagnetic layer 30 is read by applying the pulse voltage PVr. In the case where the magnetization 12 of the second ferromagnetic layer 20 is upward in the configuration of the magnetic memory element 115 as shown in FIG. 20C, the orientation of the magnetization 13 of the third ferromagnetic layer 30 is set to be upward. Thereby, the orientation of the rotating magnetic field generated when the magnetization 13 of the third ferromagnetic layer 30 oscillates matches the orientation of the procession of the second ferromagnetic layer 20. In the case where the direction of the magnetization 13 of the third ferromagnetic layer 30 is downward, the direction of the magnetization 13 is caused to reverse upward by applying the third pulse voltage PV3. Subsequently, the magnetization 13 of the third ferromagnetic layer 30 is caused to oscillate by the spin-transfer torque by applying the fourth pulse voltage PV4.

Compared to the magnetic memory element 114 described in the second example, the distance in the Z-axis direction between the second ferromagnetic layer 20 and the third ferromagnetic layer 30 can be shorter in the magnetic memory element 115. Therefore, the magnetization reversal of the magnetization 13 of the third ferromagnetic layer 30 can be performed more efficiently in the magnetic memory element 115.

Second Embodiment

In the embodiment, multiple magnetic memory elements are disposed in a matrix configuration.

Figure 21:
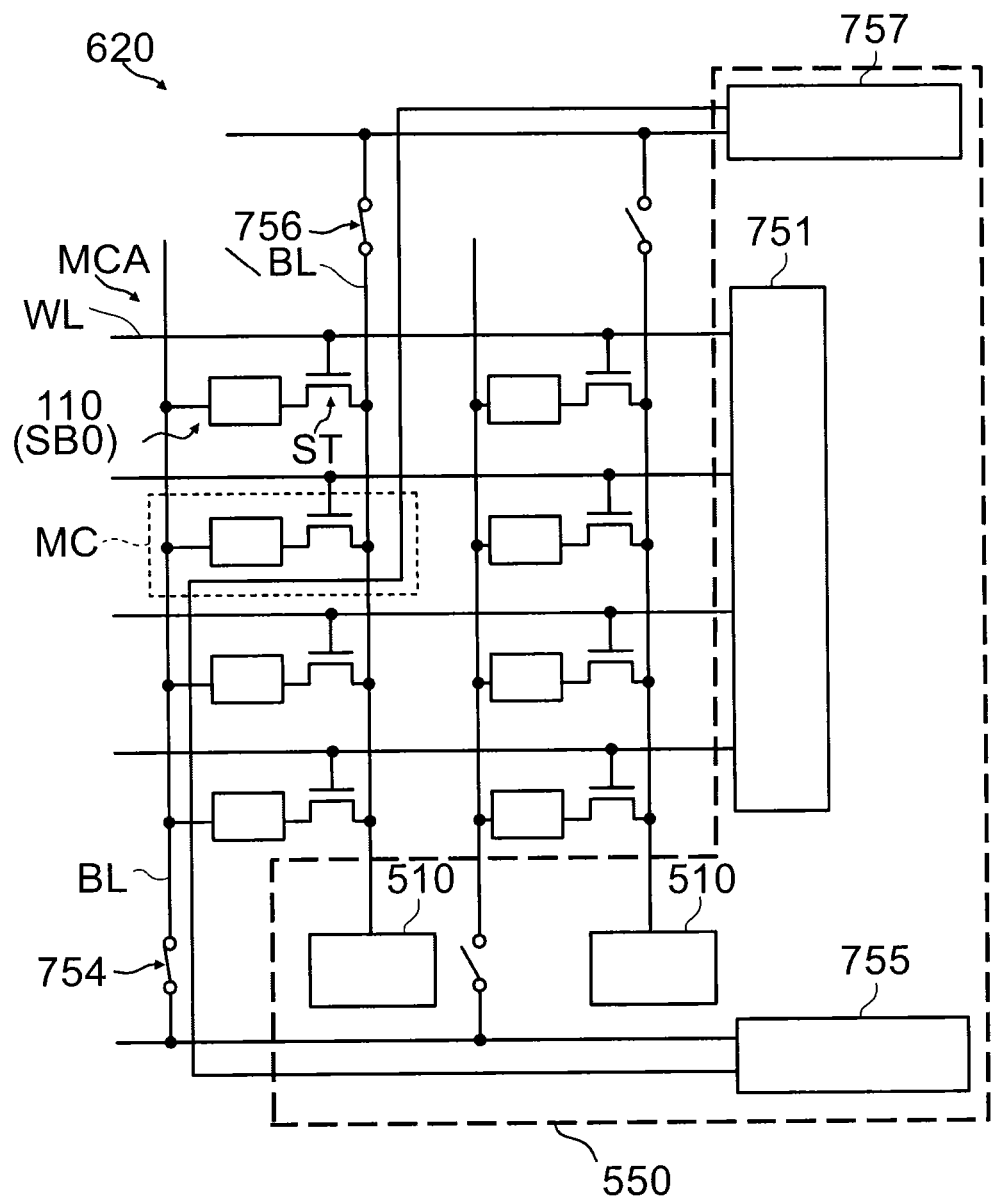
FIG. 21 is a schematic view showing a nonvolatile memory device according to a second embodiment.

FIG. 21 is a schematic view showing a nonvolatile memory device according to the second embodiment.

As shown in FIG. 21, the nonvolatile memory device 620 according to the embodiment includes a memory cell array unit MCA. The memory cell array unit MCA includes multiple memory cells MC arranged in a matrix configuration.

Each of the memory cells MC includes one selected from the magnetic memory elements according to the first embodiment. In the example, the magnetic memory element 110 is used.

Multiple bit interconnect pairs (a bit interconnect BL and a bit interconnect bar-BL) and multiple word interconnects WL are disposed in the memory cell array unit MCA. Each of the multiple bit interconnect pairs extends in the column direction. Each of the multiple word interconnects WL extends in the row direction.

The memory cells MC are disposed at the intersections between the bit interconnects BL and the word interconnects WL. Each of the memory cells MC includes a magnetic memory element (e.g., the magnetic memory element 110) and a selection transistor ST. One end of the magnetic memory element 110 is connected to the bit interconnect BL. The other end of the magnetic memory element 110 is connected to the drain terminal of the selection transistor ST. The gate terminal of the selection transistor ST is connected to the word interconnect WL. The source terminal of the selection transistor ST is connected to the bit interconnect bar-BL.

A row decoder 751 is connected to the word interconnects WL. One end of one of the bit interconnect pair (e.g., the bit interconnect bar-BL) is connected to a read-out unit 510. The other end of the one of the bit interconnect pair (e.g., the bit interconnect bar-BL) is connected to a first power supply source/sink circuit 757 via a switch 756. The other of the bit interconnect pair (e.g., the bit interconnect BL) is connected to a second power supply source/sink circuit 755 via a switch 754.

For example, the control unit 550 includes the read-out unit 510, the row decoder 751, the first power supply source/sink circuit 757, and the second power supply source/sink circuit 755. The control unit 550 is electrically connected to each of the multiple magnetic memory elements 110 via the bit interconnects BL, the word interconnects WL, the selection transistors ST, etc. The control unit 550 implements the programming of the data and the reading of the data for each of the multiple magnetic memory elements 110.

By such a configuration, the data can be programmed to any memory cell MC (e.g., any magnetic memory element 110) of the memory cell array unit MCA; and the data programmed to the magnetic memory element 110 can be read. In a nonvolatile memory device 620 thus configured, misoperations can be suppressed by the control unit 550 implementing the first setting operation after implementing the first preliminary operation.

According to the embodiments, a nonvolatile memory device in which misoperations are suppressed is provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nonvolatile memory devices such as magnetic memory elements, control units, stacked bodies, first and second stacked units, first to fourth ferromagnetic layers, first and second nonmagnetic layers, nonmagnetic tunneling barrier layers, nonmagnetic metal layers, magnetic shields, etc., from known art; and such practice is included in the scope of the invention to the extent that similar effects are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a magnetic memory element including a stacked body, the stacked body including
a first stacked unit including:
a first ferromagnetic layer having a fixed direction of magnetization;
a second ferromagnetic layer having a changeable direction of magnetization; and
a first nonmagnetic layer provided between the first ferromagnetic layer and the second ferromagnetic layer,
the first ferromagnetic layer, the second ferromagnetic layer, and the first nonmagnetic layer being stacked in a stacking direction, and
a second stacked unit stacked with the first stacked unit in the stacking direction including:
a third ferromagnetic layer having a changeable direction of magnetization; and
a nonmagnetic tunneling barrier layer stacked with the third ferromagnetic layer in the stacking direction to contact the third ferromagnetic layer; and
a control unit electrically connected to the magnetic memory element,
the control unit being configured to implement a first operation of setting the magnetic memory element to be in a first state, the first operation including:
a first preliminary operation of applying a first pulse voltage having a first rising time to the magnetic memory element; and
a first setting operation of applying a second pulse voltage having a second rising time to the magnetic memory element after the first preliminary operation, the second rising time being longer than the first rising time.

2. The device according to claim 1, wherein
the first operation is an operation of setting the direction of the magnetization of the second ferromagnetic layer to be in a first direction,
the first preliminary operation includes changing the direction of the magnetization of the third ferromagnetic layer to be in a second direction, and
the first setting operation is an operation of setting the direction of the magnetization of the second ferromagnetic layer to be in the first direction.

3. The device according to claim 2, wherein
the magnetization of the third ferromagnetic layer processes with a direction different from the second direction as an axis when the first pulse voltage is applied, and
the magnetization of the third ferromagnetic layer becomes oriented in the second direction when the first pulse voltage ends.

4. The device according to claim 3, wherein a duration tp1 of the first pulse voltage is not less than 0.75 times $(Cp/2) \times (2n-1)$ and not more than 1.25 times $(Cp/2) \times (2n-1)$ (n being an integer not less than 1), where a period of the procession is Cp.

5. The device according to claim 1, wherein
the control unit further implements a second operation of setting the magnetic memory element to be in a second state different from the first state, and
the second operation includes:
a second preliminary operation of applying a third pulse voltage having a third rising time to the magnetic memory element; and
a second setting operation of applying a fourth pulse voltage to the magnetic memory element after the second preliminary operation, the fourth pulse voltage having a fourth rising time longer than the third rising time and a polarity different from the polarity of the second pulse voltage.

6. The device according to claim 5, wherein
the second operation is an operation of setting the direction of the magnetization of the second ferromagnetic layer to be in a third direction,
the second preliminary operation includes changing the direction of the magnetization of the third ferromagnetic layer to be in a fourth direction, and
the second setting operation is an operation of setting the direction of the magnetization of the second ferromagnetic layer to be in the third direction.

7. The device according to claim 1, wherein
a component of the magnetization of the first ferromagnetic layer in the stacking direction is larger than a component of the magnetization of the first ferromagnetic layer in a in-plane direction perpendicular to the stacking direction,
a component of the magnetization of the second ferromagnetic layer in the stacking direction is larger than a component of the magnetization of the second ferromagnetic layer in the in-plane direction, and
a component of the magnetization of the third ferromagnetic layer in the stacking direction is larger than a component of the magnetization of the third ferromagnetic layer in the in-plane direction.

8. The device according to claim 1, wherein the third ferromagnetic layer generates a high frequency magnetic field by the applying of the second pulse voltage, and the high frequency magnetic field is applied to the second ferromagnetic layer.

9. The device according to claim 1, wherein the nonmagnetic tunneling barrier layer is disposed between the first stacked unit and the third ferromagnetic layer.

10. The device according to claim 1, wherein
the second stacked unit further includes a fourth ferromagnetic layer having a fixed direction of magnetization, and
the nonmagnetic tunneling barrier layer is disposed between the third ferromagnetic layer and the fourth ferromagnetic layer.

11. The device according to claim 10, wherein an orientation of a component of the magnetization of the first ferromagnetic layer projected onto the stacking direction is the reverse of an orientation of a component of the magnetization of the fourth ferromagnetic layer projected onto the stacking direction.

12. The device according to claim 1, wherein the magnetic memory element further includes a magnetic shield covering at least a portion of a side surface of the stacked body.

13. The device according to claim 1, wherein
the stacked body further includes a second nonmagnetic layer provided between the first stacked unit and the second stacked unit, and
the second nonmagnetic layer includes one metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two metals selected from the group.

14. The device according to claim 1, wherein
the stacked body further includes a second nonmagnetic layer provided between the first stacked unit and the second stacked unit,
the second nonmagnetic layer includes one metal selected from the group consisting of ruthenium (Ru), osmium (Os), and iridium (Ir) or an alloy including at least two metals selected from the group, and
a thickness of the second nonmagnetic layer is not more than 3 nanometers.

15. The device according to claim 1, wherein
a length of the third ferromagnetic layer in a direction perpendicular to the stacking direction is not more than 35 nanometers, and
a length of the third ferromagnetic layer in the stacking direction is not less than 0.5 nanometers and not more than 3.5 nanometers.

16. The device according to claim 1, wherein the second stacked unit further includes:
a fourth ferromagnetic layer having a changeable direction of magnetization; and
a nonmagnetic metal layer provided between the third ferromagnetic layer and the fourth ferromagnetic layer.

17. The device according to claim 1, wherein
the second stacked unit further includes:
a fifth ferromagnetic layer stacked with the third ferromagnetic layer in the stacking direction; and
a third nonmagnetic layer provided between the third ferromagnetic layer and the fifth ferromagnetic layer, and
a component of the magnetization of the fifth ferromagnetic layer in a direction perpendicular to the stacking direction is larger than a component of the magnetization of the fifth ferromagnetic layer in the stacking direction.

18. The device according to claim 1, wherein a length of the third ferromagnetic layer in one direction perpendicular to the stacking direction is longer than a length of the third ferromagnetic layer in the stacking direction and a length of the third ferromagnetic layer in one other direction perpendicular to the one direction.

19. The device according to claim 2, wherein the control unit, in the first operation, applies a pulse voltage to the magnetic memory element to read the direction of the magnetization of the third ferromagnetic layer, and implements the first preliminary operation and the first setting operation when the direction of the magnetization of the third ferromagnetic layer is different from the second direction, and implements the first setting operation without implementing the first preliminary operation when the direction of the magnetization of the third ferromagnetic layer is the second direction.

20. The device according to claim 1, wherein
a plurality of the magnetic memory elements is provided, and
the control unit is electrically connected to each of the plurality of magnetic memory elements.

* * * * *